(12) United States Patent
Ozeki et al.

(10) Patent No.: US 11,113,498 B2
(45) Date of Patent: Sep. 7, 2021

(54) DETECTION DEVICE

(71) Applicant: Japan Display Inc., Tokyo (JP)

(72) Inventors: Yoshitaka Ozeki, Tokyo (JP); Hayato Kurasawa, Tokyo (JP); Toshinori Uehara, Tokyo (JP); Koshiro Moriguchi, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 16/293,250

(22) Filed: Mar. 5, 2019

(65) Prior Publication Data

US 2019/0278966 A1    Sep. 12, 2019

(30) Foreign Application Priority Data

Mar. 6, 2018   (JP) .............. JP2018-039943

(51) Int. Cl.
| | | |
|---|---|---|
| *H01L 27/12* | (2006.01) | |
| *G06K 9/00* | (2006.01) | |
| *H01L 29/423* | (2006.01) | |
| *G06F 3/041* | (2006.01) | |

(52) U.S. Cl.
CPC ......... *G06K 9/0002* (2013.01); *G06F 3/0412* (2013.01); *H01L 27/1214* (2013.01); *H01L 27/1251* (2013.01); *H01L 29/42384* (2013.01)

(58) Field of Classification Search
CPC .............. H01L 27/1214; H01L 27/124; H01L 27/1251; H01L 29/42384
See application file for complete search history.

(56) References Cited

U.S. PATENT DOCUMENTS

| | | | |
|---|---|---|---|
| 2013/0077379 A1* | 3/2013 | Matsudaira | ............. H01L 45/04 365/148 |
| 2017/0213065 A1 | 7/2017 | Kurasawa et al. | |
| 2017/0285846 A1 | 10/2017 | Mizuhashi et al. | |

FOREIGN PATENT DOCUMENTS

| | | |
|---|---|---|
| JP | 2013-110291 A | 6/2013 |
| JP | 2017-134828 A | 8/2017 |
| JP | 2017-182348 A | 10/2017 |

* cited by examiner

*Primary Examiner* — Suberr L Chi
(74) *Attorney, Agent, or Firm* — K&L Gates LLP

(57) ABSTRACT

According to one embodiment, a detection device includes a substrate, a drive electrode provided on the substrate, a detection electrode provided on the substrate and capacitively coupling with the drive electrode, and a first thin film transistor and a second thin film transistor, electrically connected to the drive electrode, and the first thin film transistor has a withstand voltage higher than a withstand voltage of the second thin film transistor.

19 Claims, 22 Drawing Sheets

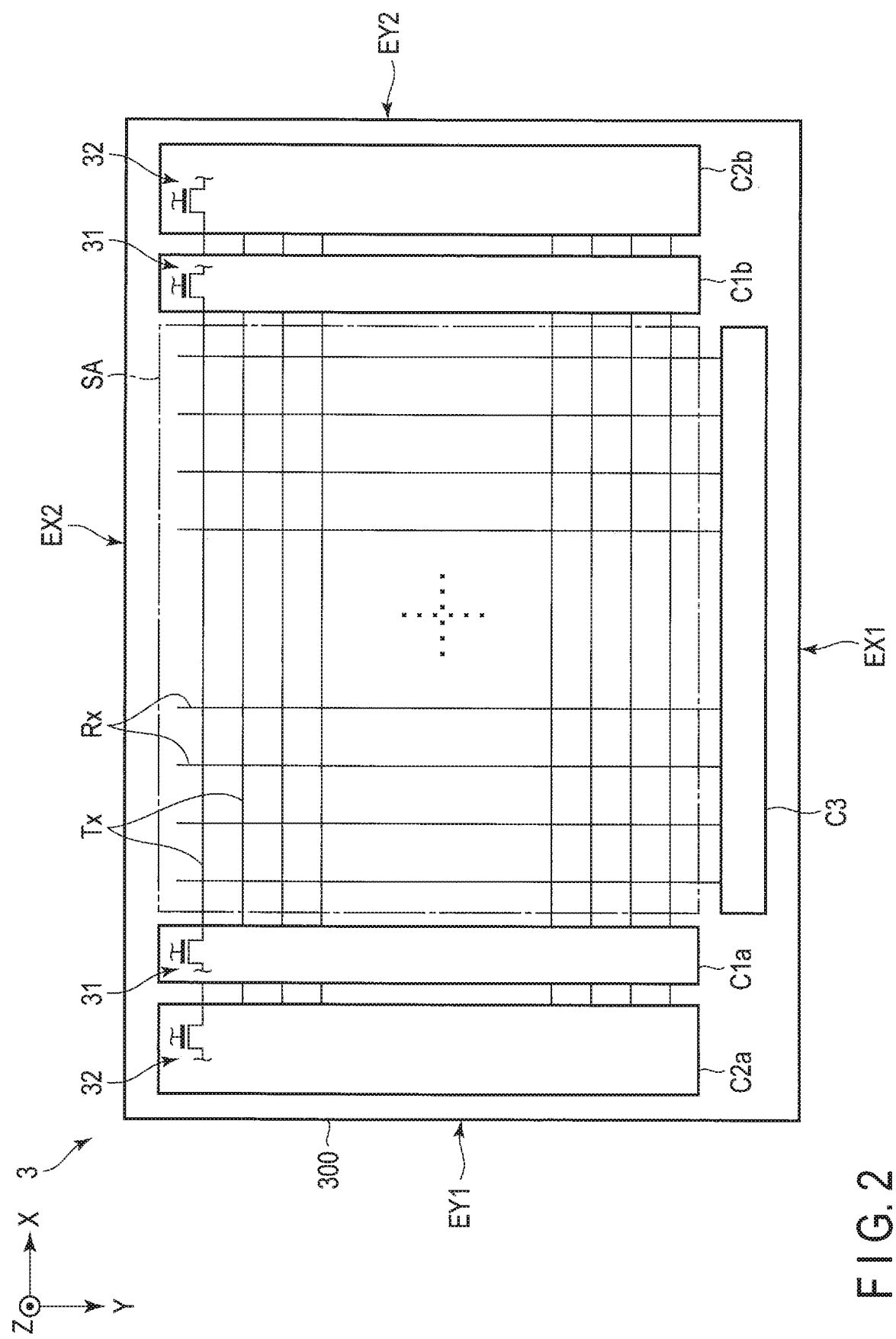
F I G. 2

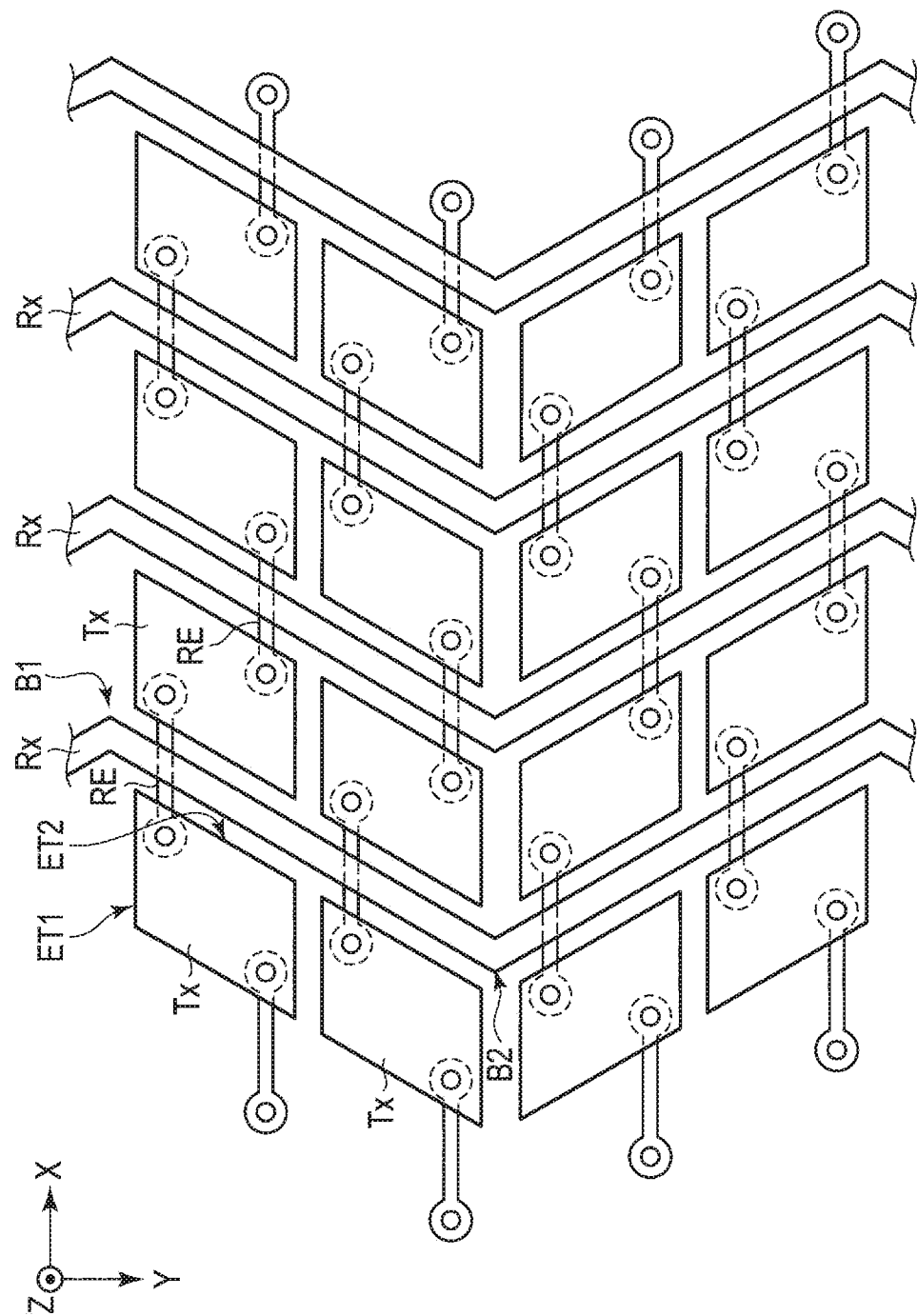
F I G. 8

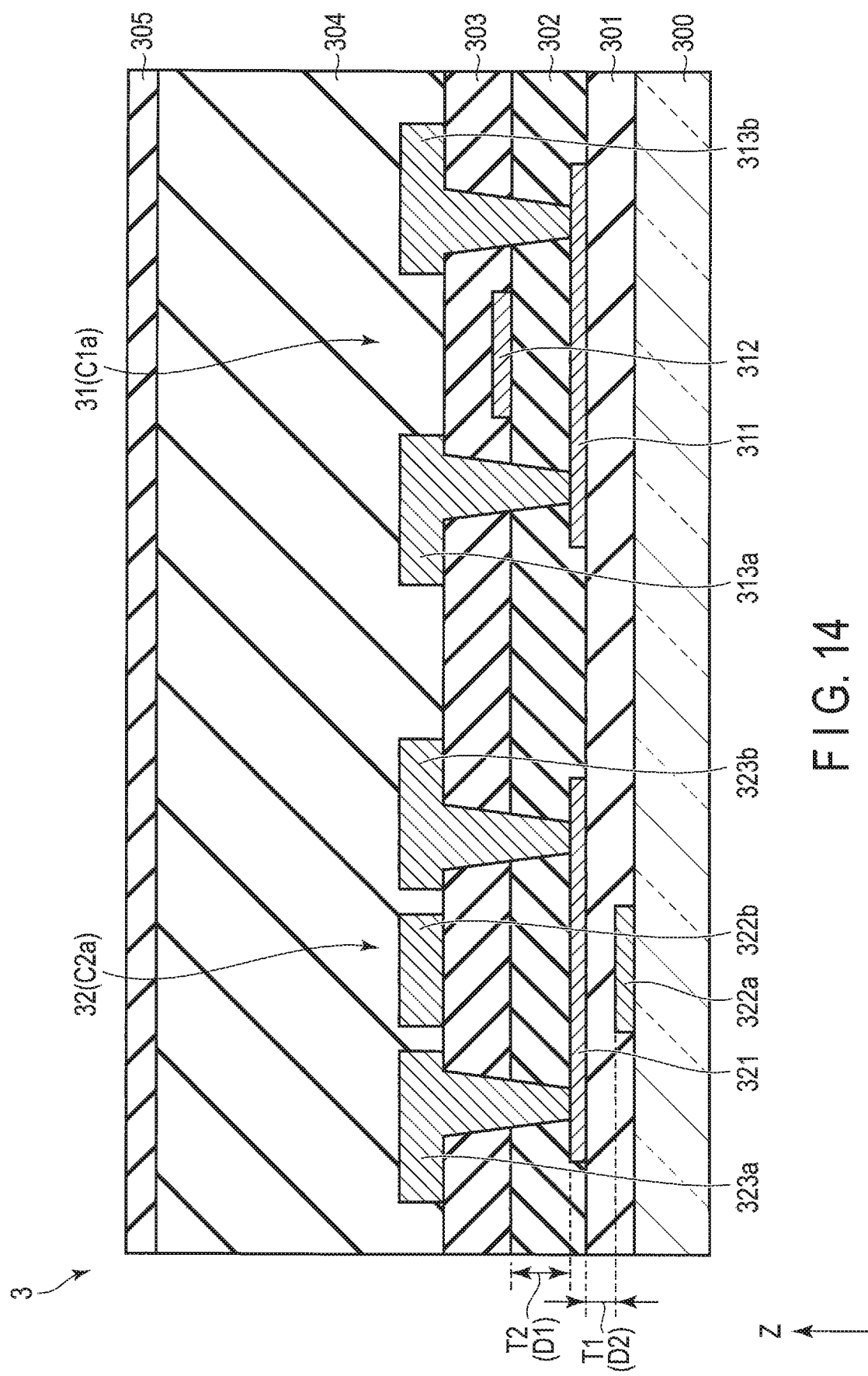
F I G. 14

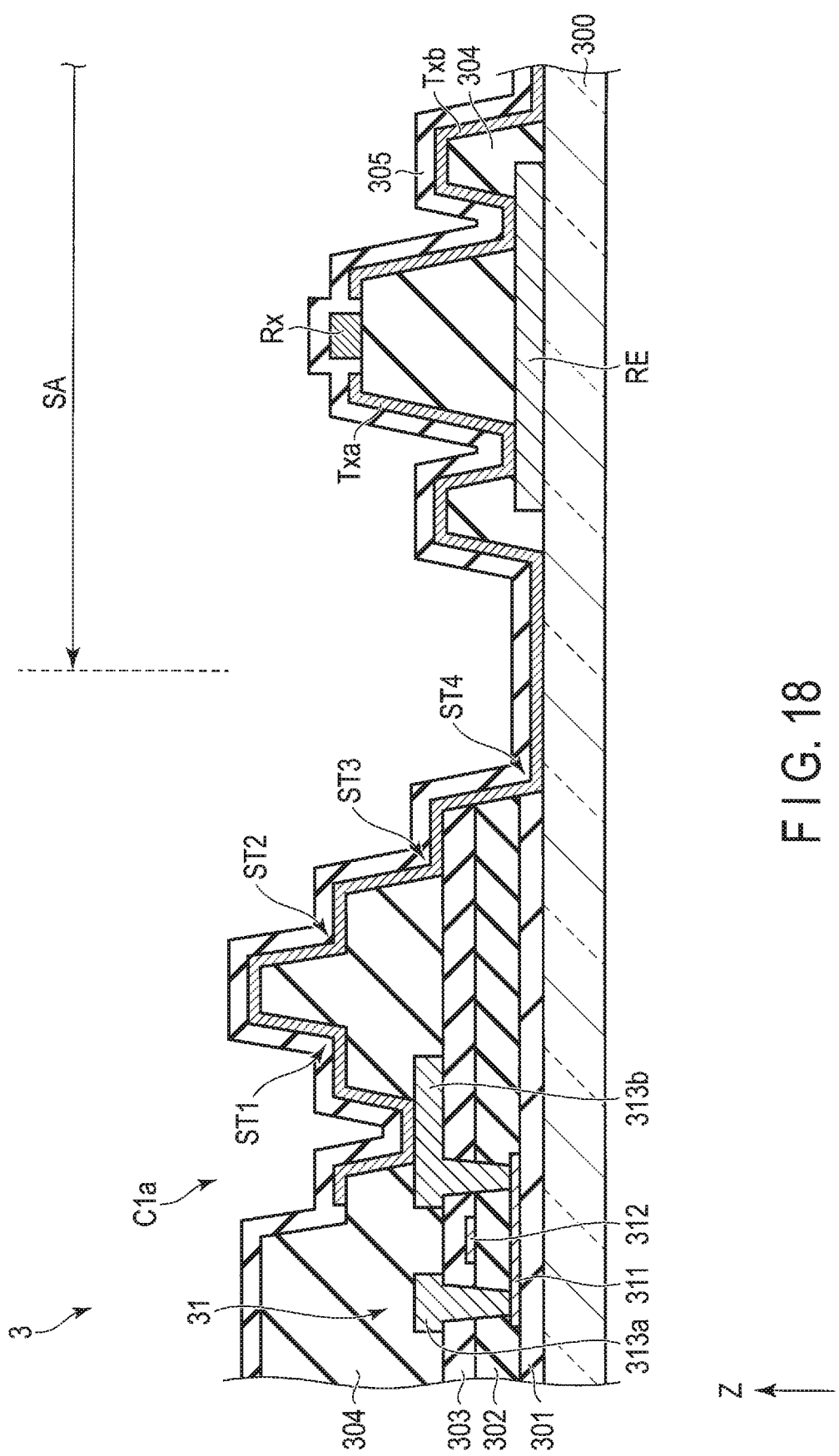
F I G. 18

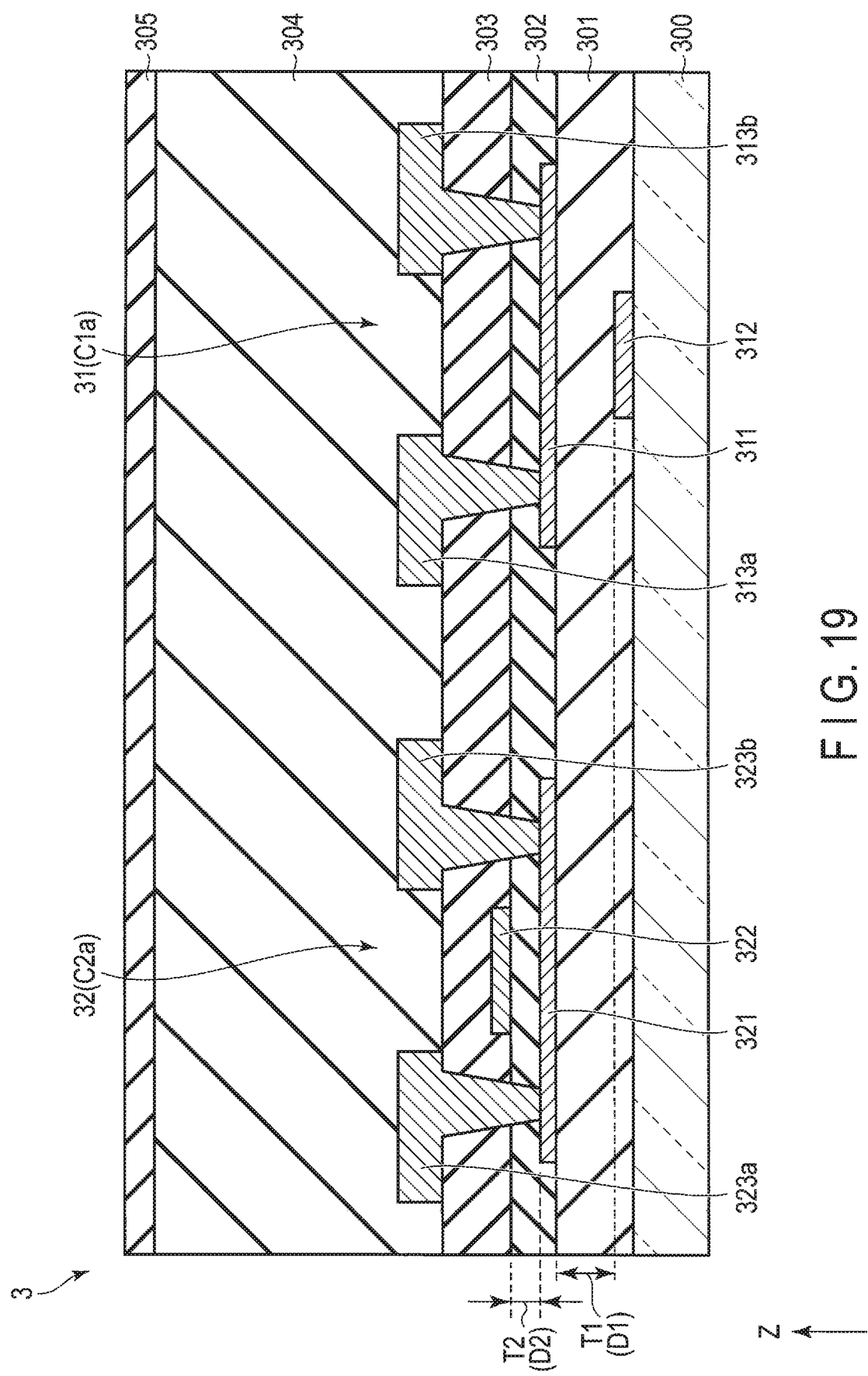
F I G. 19

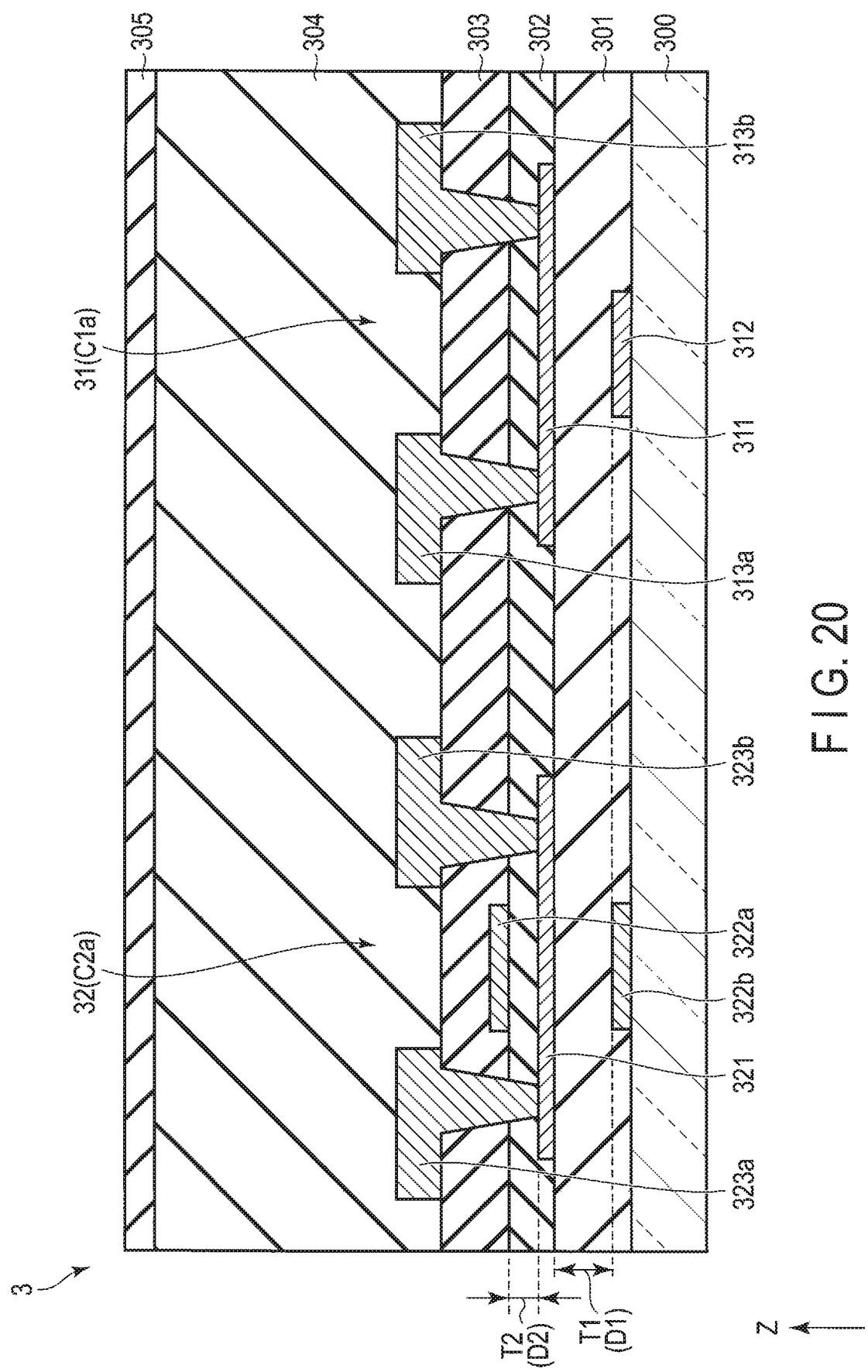
F I G. 20

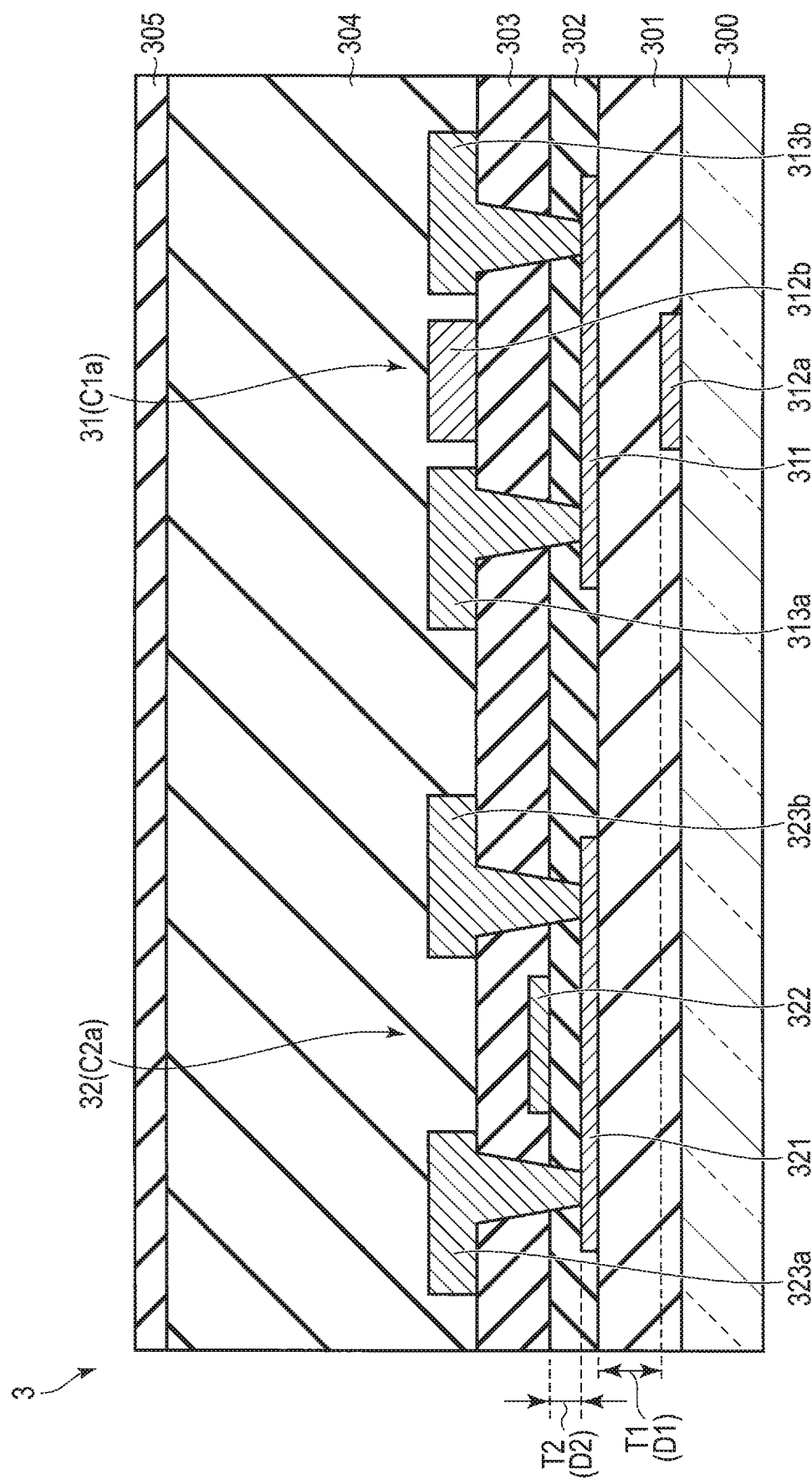
F I G. 21

DETECTION DEVICE

CROSS-REFERENCE TO RELATED APPLICATIONS

This application is based upon and claims the benefit of priority from Japanese Patent Application No. 2018-039943, filed Mar. 6, 2018, the entire contents of which are incorporated herein by reference.

FIELD

Embodiments described herein relate generally to a detection device.

BACKGROUND

Display devices comprising a detection device which detects approach or contact of an object have been developed. In recent years, display devices with a detection device which detects, for example, fingerprints for personal authentication are developing. The detection device comprises, for example, detection electrodes for detecting change in static capacitance, driving electrodes, a plurality of circuits electrically connected to the driving electrodes. These circuits may function in different way each other, therefore voltages supplied to them may be different.

In such a detection device, when a gate insulating film of a thin film transistor included in a circuit is thickened, the withstand voltage of the thin film transistor to the drive voltage is increased, but there is a tendency that the ON-current value of the thin film transistor falls. As a result, the size of the thin film transistor is increased, and thus the narrowing of the frame region, which does not contribute to the detection of fingerprints and the like, may be undesirably interfered with.

SUMMARY

The present application generally relates to a detection device.

According to one embodiment, a detection device includes a substrate, a drive electrode provided on the substrate, a detection electrode provided on the substrate and capacitively coupling with the drive electrode, and a first thin film transistor and a second thin film transistor, electrically connected to the drive electrode, and the first thin film transistor has a withstand voltage higher than a withstand voltage of the second thin film transistor.

BRIEF DESCRIPTION OF THE DRAWINGS

FIG. 2 is a plan view schematically showing a detection device shown in FIG. 1.

FIG. 8 is a plan view schematically showing an example of arrangement of a detection electrode Rx and a drive electrode Tx shown in FIG. 2.

FIG. 14 is a cross section showing another example of the first embodiment.

FIG. 18 shows another example of the first embodiment.

FIG. 19 is a cross section showing a detection device 3 according to the second embodiment.

FIG. 20 shows another example of the second embodiment.

FIG. 21 shows another example of the second embodiment.

DETAILED DESCRIPTION

Figure 1:
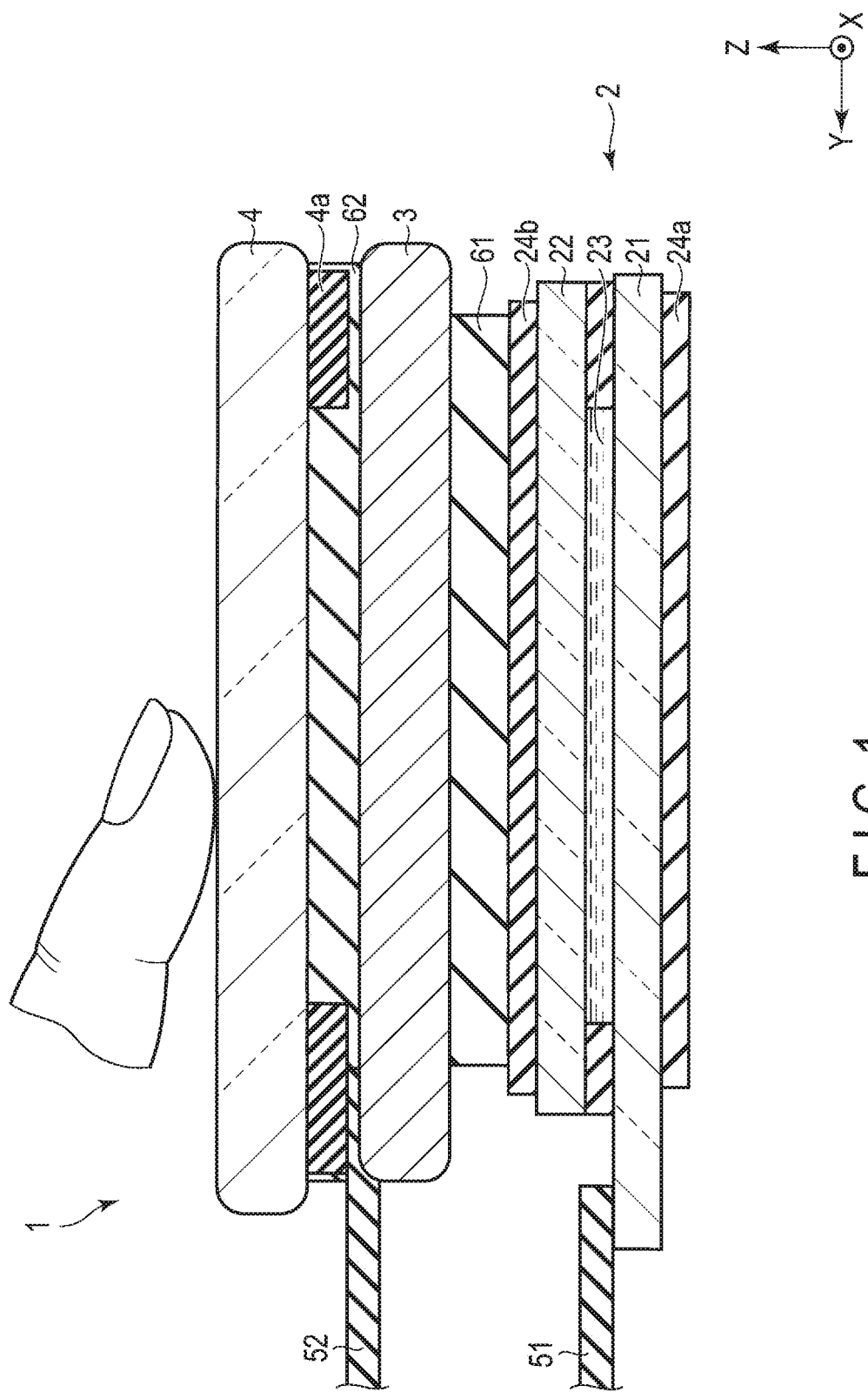
FIG. 1 is a cross section showing a display device 1 in which a detection device to according to the first embodiment is applied.

In general, according to one embodiment, a detection device comprise a substrate, a drive electrode provided on the substrate, a detection electrode provided on the substrate and capacitively coupling with the drive electrode, and a first thin film transistor and a second thin film transistor, electrically connected to the drive electrode, and the first thin film transistor has a withstand voltage higher than a withstand voltage of the second thin film transistor.

The embodiments will be described hereinafter with reference to the accompanying drawings. Note that the disclosure is presented for the sake of exemplification, and any modification and variation conceived within the scope and spirit of the invention by a person having ordinary skill in the art are naturally encompassed in the scope of invention of the present application. In addition, in some cases, in order to make the description clearer, the widths, thicknesses, shapes, etc., of the respective parts are schematically illustrated in the drawings and compared to the actual modes. However, the schematic illustration is merely an example, and adds no restrictions to the interpretation of the invention. In addition, in the specification and drawings, the structural elements, which have functions identical or similar to the functions described in connection with preceding drawings, are denoted by like reference numbers, and an overlapping detailed description thereof may be omitted unless otherwise necessary.

First Embodiment

FIG. 1 is a cross section showing a display device 1 in which a detection device to according to the first embodiment is applied. In the drawings, a first direction X, a second direction Y and a third direction Z are orthogonal to each other, but they may cross each other at an angle other than 90 degrees. In this specification, the direction towards a tip of an arrow head indicating the third direction Z is called "above", and the direction opposite thereto from the tip of the arrow head is called "below". Further, when it is assumed that an observation position at which the display device 1 is to be observed is located at the pointing end side of the arrow indicating the third direction Z, a view toward an X-Y plane defined by the first direction X and the second direction Y is referred to as a plan view.

The display device 1 of this embodiment has, in addition to the display function of displaying images, the detection function of detecting the approaching or contact of an object. The display device 1 comprises a display panel 2, a detection device 3, a cover 4, circuit boards 51 and 52, etc.

The display panel 2 is, for example, a liquid crystal display panel. The display panel 2 comprises a first substrate 21, a second substrate 22, a liquid crystal layer 23, polarizers 24a and 24b. The first substrate 21 and the second substrate 22 oppose each other. The liquid crystal layer 23 is provided between the first substrate 21 and the second substrate 22. The polarizers 24a and 24b have transmission axes normal to each other and the first substrate 21, the second substrate 22, and the liquid crystal layer 23 are interposed therebetween. The circuit board 51 is connected to an end portion of the display panel 2. Various signals for driving the display panel 2 are supplied from an external device via the circuit board 51.

The detection device 3 is, for example, a static capacitive detection device. The detection device 3 is located on the display panel 2, and is adhered to the display panel 2 with an adhesive 61. In the example illustrated, the detection device 3 is adhered to the polarizer 24b. The circuit board 52 is connected to one end portion of the detection device 3. Various signals for driving the detection device 3 are supplied from an external device via the circuit board 52.

The cover 4 is located on the detection device 3, and adhered to the detection device 3 with an adhesive 62. The cover 4 is formed from, for example, a transparent material such as glass or resin. In the example illustrated, the cover 4 comprises a resin layer 4a colored in black on a surface opposing the detection device 3. The region where the resin layer 4a is formed is equivalent to a non-display area of the display panels 2.

FIG. 2 is a plan view schematically showing the detection device shown in FIG. 1. The detection device 3 involves a substrate 300. The substrate 300 is, for example, a quadrangle and in the example illustrated, rectangular. The substrate 300 comprises end edges EX1 and EX2 extending along the first direction X, and end edges EY1 and EY2 extending along the second direction Y. The detection device 3 comprises buffer circuits C1a and C1b, selection circuits C2a and C2b, a detection circuit C3, detection electrodes Rx, and drive electrodes Tx on the substrate 300.

The buffer circuit C1a and the selection circuit C2a are provided along the end edge EY1. The selection circuit C2a is located closer to the end edge EY1 as compared to the buffer circuit C1a. The buffer circuit C1b and the selection circuit C2b are provided along the end edge EY2. The selection circuit C2b is located closer to the end edge EY2 as compared to the buffer circuit C1b. The detection circuit C3 is provided along the end edge EX1. In this embodiment, the buffer circuits C1a and C1b contain transistors 31 respectively, and the selection circuits C2a and C2b contain transistors 32.

The detection electrodes Rx and the drive electrodes Tx are arranged to cross each other without being in contact. With this structure, between one of the drive electrodes Tx and one of the detection electrodes Rx, static capacitance is formed when a drive signal is supplied to the drive electrode. For example, the drive electrodes Tx each extend along the first direction X, and are arranged along the second direction Y so as to be spaced apart from each other. One end portion of each drive electrode Tx is connected to the buffer circuit C1a and the selection circuit C2a. The other end portion of each drive electrode Tx is connected to the buffer circuit C1b and the selection circuit C2b. The detection electrodes Rx each extend along the second direction Y and are arranged along the first direction X so as to be spaced apart from each other. One end portion of each detection electrode Rx is connected to the detection circuit C3. In the first direction X, all the detection electrodes Rx are arranged between the buffer circuit C1a and the buffer circuit C1b. In the following descriptions, the region where the detection electrodes Rx and the drive electrodes Tx are disposed may be called a sensor area SA for convenience. In FIG. 2, the sensor area SA is equivalent to the region surrounded by alternate long and short dash lines.

The selection circuits C2a and C2b select the drive electrodes Tx sequentially. The buffer circuits C1a and C1b set the amplitude of the voltage to be applied to each drive electrode Tx to a specified value. The detection circuit C3 detects approach or contact of an object, for example, a finger, from variation in static capacitance formed between each drive electrode Tx and the detection electrode Rx. For example, the detection circuit C3 judges that an object approaches or contacts when the change in the signal detected by the respective detection electrode Rx is greater than a specified value.

In the detection device 3, the drive electrodes Tx and the detection electrodes Rx are arranged so densely that minute surface configurations such as, for example, a fingerprint can be detected. To obtain a detection signal resulting from such very fine configurations, the amplitude of the drive signals (amplitude of voltage) supplied to the drive electrodes Tx needs to be sufficiently great. Therefore, in this embodiment, voltages supplied to the buffer circuits C1a and C1b which serve as a supply source of drive signals may be higher than those to the selection circuits C2a and C2b for selecting the drive electrodes where the drive signals are supplied.

Figure 3:
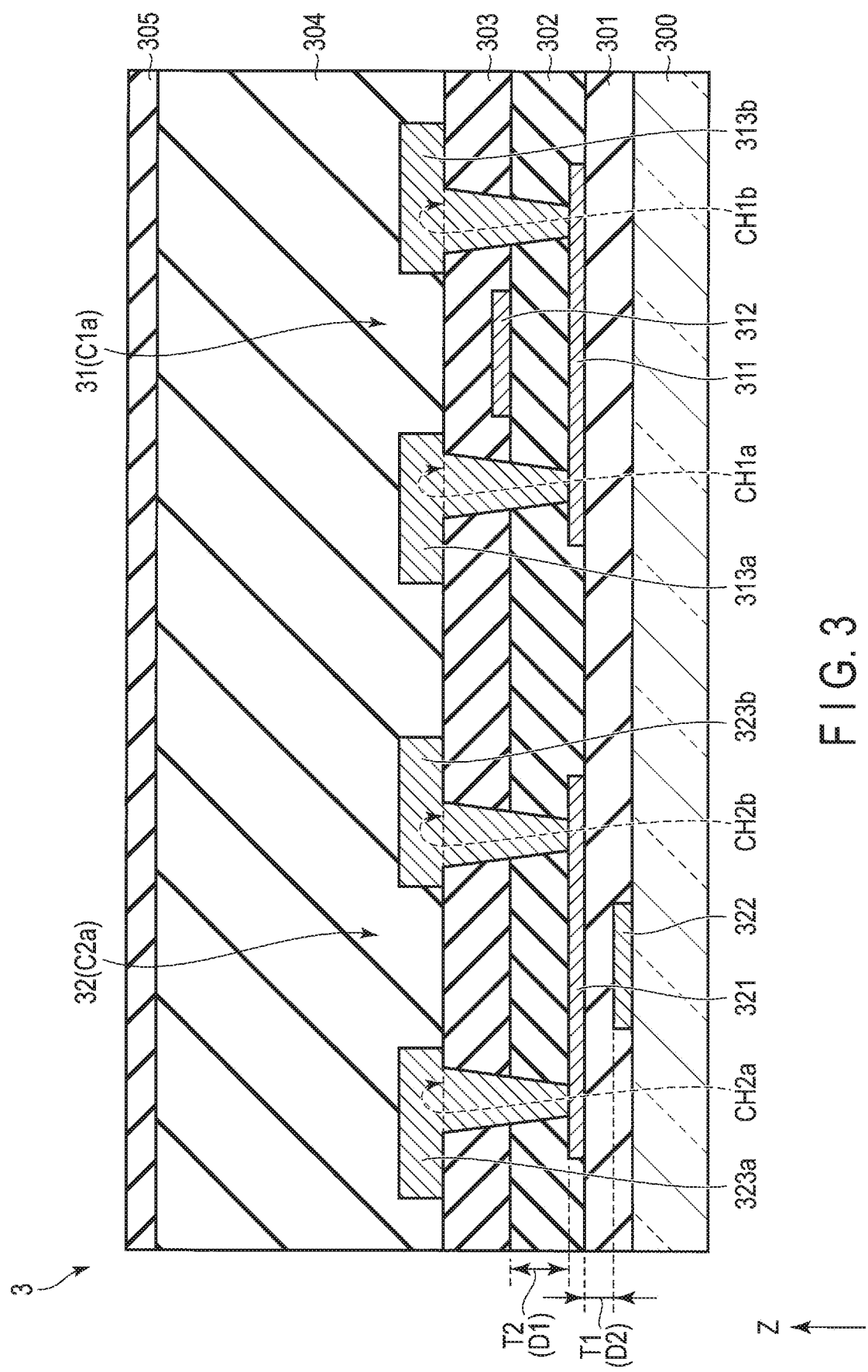
FIG. 3 is a cross section partially showing a buffer circuit C1a and a selection circuit C2a shown in FIG. 2.

FIG. 3 is a cross section partially showing the buffer circuit C1a and the selection circuit C2a shown in FIG. 2. The detection device 3 includes the substrate 300, insulating films 301, 302, 303, 304 and 305, the transistor 31, the transistor 32 and the like. The insulating films 301, 302, 303, 304 and 305 are stacked on the substrate 300 in this order.

The transistor 31 is, for example, a top-gate thin film transistor. The transistor 31 comprises a semiconductor layer 311, a gate electrode 312, an electrode 313a and an electrode 313b. The semiconductor layer 311 is located on the insulating film 301, and is covered by the insulating film 302. The gate electrode 312 is located on the insulating film 302, and is covered by the insulating film 303. The electrodes 313a and 313b are located on the insulating film 303, and are covered by the insulating film 304. In contact holes CH1a and CH1b which penetrate the insulating films 302 and 303, respectively, the electrodes 313a and 313b each are in contact with the semiconductor layer 311.

The transistor 32 is, for example, a bottom-gate thin film transistor. The transistor 32 comprises a semiconductor layer 321, a gate electrode 322, an electrode 323a and an electrode 323b. The gate electrode 322 is located on the substrate 300, and is covered by the insulating film 301. The gate electrode 321 is located on the insulating film 301, and is covered by the insulating film 302. The electrodes 323a and 323b are located on the insulating film 303, and are covered by the insulating film 304. In contact holes CH2a and CH2b which penetrate the insulating films 302 and 303, respectively, the electrodes 323a and 323b each are in contact with the semiconductor layer 321.

The semiconductor layers 311 and 321 are formed of, for example, polycrystalline silicon. Note that the semiconductor layers 311 and 321 may be formed of, for example, a transparent amorphous oxide semiconductor. The gate electrodes 312 and 322 and the electrodes 313a, 313b, 323a and 323b are formed from, for example, a metal material such as aluminum, titanium, silver, molybdenum, tungsten, copper or chromium or an alloy of a combination of any of these. These electrodes may be of a single- or multi-layered structure. The insulating films 301, 302, 303 and 305 are each formed of, for example, an inorganic insulating material such as silicon oxide, silicon nitride or silicon oxynitride. The insulating film 304 is formed of, for example, an organic insulating material such as polyimide.

In this embodiment, the drive voltage of the transistor 31 is a voltage (inter-gate-sauce voltage) Vgs1 to be applied between the gate electrode 322 and the electrodes 323a. The inter-gate-sauce voltage Vgs1 of the transistor 31 is, for example, about ±20V. The drive voltage of the transistor 32 is a voltage (inter-gate sauce voltage) Vgs2 to be applied between the gate electrode 322 and, for example, the electrode 323a. For example, the inter-gate sauce voltage Vgs2 of the transistor 32 is about ±10V.

As described above, the semiconductor layers 311 and 321 are of the same layer, and both are located between the insulating film 301 and the insulating film 302. The gate electrode 312 opposes the semiconductor layer 311 via the insulating film 302. The gate electrode 322 opposes the semiconductor layer 321 via the insulating film 301. In such a structure, the insulating film 302 functions as a gate insulating film of the transistor 31. The insulating film 301 functions as a gate insulating film of the transistor 32. For example, the insulating film 301 and the insulating film 302 are formed from the same material. That is, the relative permittivity of the insulating film 301 is equal to that of the insulating film 302. On the other hand, in this embodiment, a thickness T2 of the insulating film 302 is greater than a thickness T1 of the insulating film 301. For example, the thickness T2 is twice or more the thickness T1. In other words, a distance D1 between the gate electrode 312 and the semiconductor layer 311 in the transistor 31 is greater than a distance D2 of the gate electrode 322 and the semiconductor layer 321 in the transistor 32. As a result, the withstand voltage of the transistor 31 becomes greater than that of the transistor 32.

Figure 4:
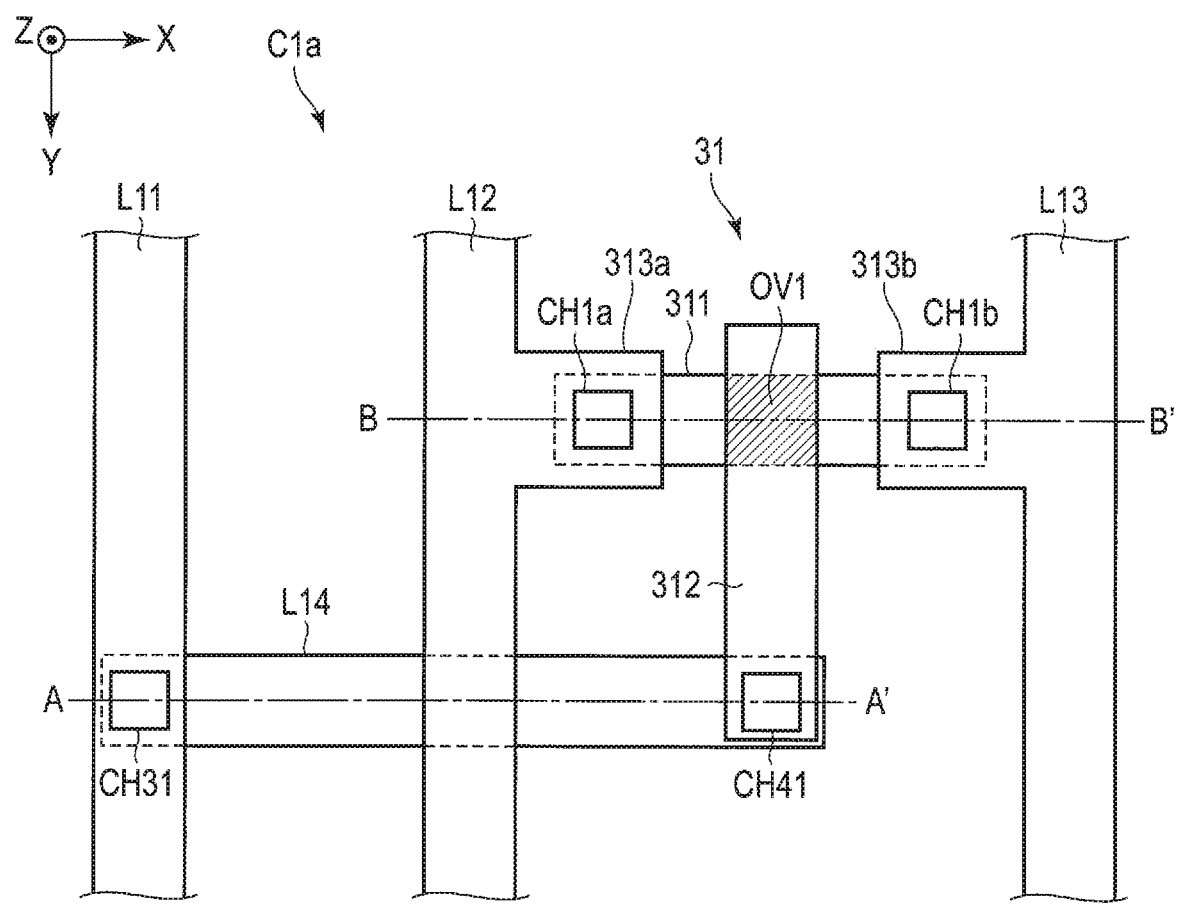
FIG. 4 is a plan view of the buffer circuit C1a shown in FIG. 3.

FIG. 4 is a plan view of the buffer circuit C1a shown in FIG. 3. In the example illustrated, the buffer circuit C1a comprises wiring lines L11, L12, L13 and L14 in addition to the transistor 31. For example, the wiring lines L11, L12 and L13 each extend along the second direction Y, and are arranged along the first direction X in this order. The wiring line L14 extends along the first direction X. In the example illustrated, the wiring line L14 intersects the wiring line L12. One end portion of the wiring line L14 is located under the wiring line L11, and the other end portion of the wiring line L14 is located between the wiring line L12 and the wiring line L13. The wiring line L14 is connected to the wiring line L11 via the contact hole CH31 provided in a region which overlaps the wiring line L11.

The electrode 313a of the transistor 31 is formed to be integrated with the wiring line L12 as one body. The electrode 313b of the transistor 31 is formed to be integrated with the wiring line L13 as one body. With this structure, the wiring line L12 and the wiring line L13 comprise respective convex portions opposing each other. The convex portion of the wiring line L12 projects toward the wiring line L13, and forms the electrode 313a. The convex portion of the wiring line L13 projects toward the wiring line L12, and forms the electrode 313b.

The semiconductor layer 311 extends along the first direction X. For example, the semiconductor layer 311 has a rectangular shape comprising long sides along the first direction X. The semiconductor layer 311 overlaps each of the electrodes 313a and 313b by end portions thereof. The contact hole CH1a is provided in a region where the semiconductor layer 311 and the electrode 313a overlap each other. The contact hole CH1b is provided in a region where the semiconductor layer 311 and the electrode 313b overlap each other.

The gate electrode 312 extends along the second direction Y between the wiring line L12 and the wiring line L13. The gate electrode 312 intersects the semiconductor layer 311 and also overlaps the other end portion of the wiring line L14. For example, the gate electrode 312 has a rectangular shape comprising a long side along the second direction Y. In the example illustrated, the gate electrode 312 overlaps approximately the center of the semiconductor layer 311. The gate electrode 312 is electrically connected to the wiring line L14 in a contact hole CH41 provided in a region which overlaps the wiring lines L14.

In this embodiment, a unit capacitance (first unit capacitance) UC1 of the transistor 31 is defined as a capacitance per unit area of a region OV1 where the gate electrode 312 and the semiconductor layer 311 overlap each other in plan view. In FIG. 4, the region OV1 is indicated as a region diagonally shaded.

Figure 5:
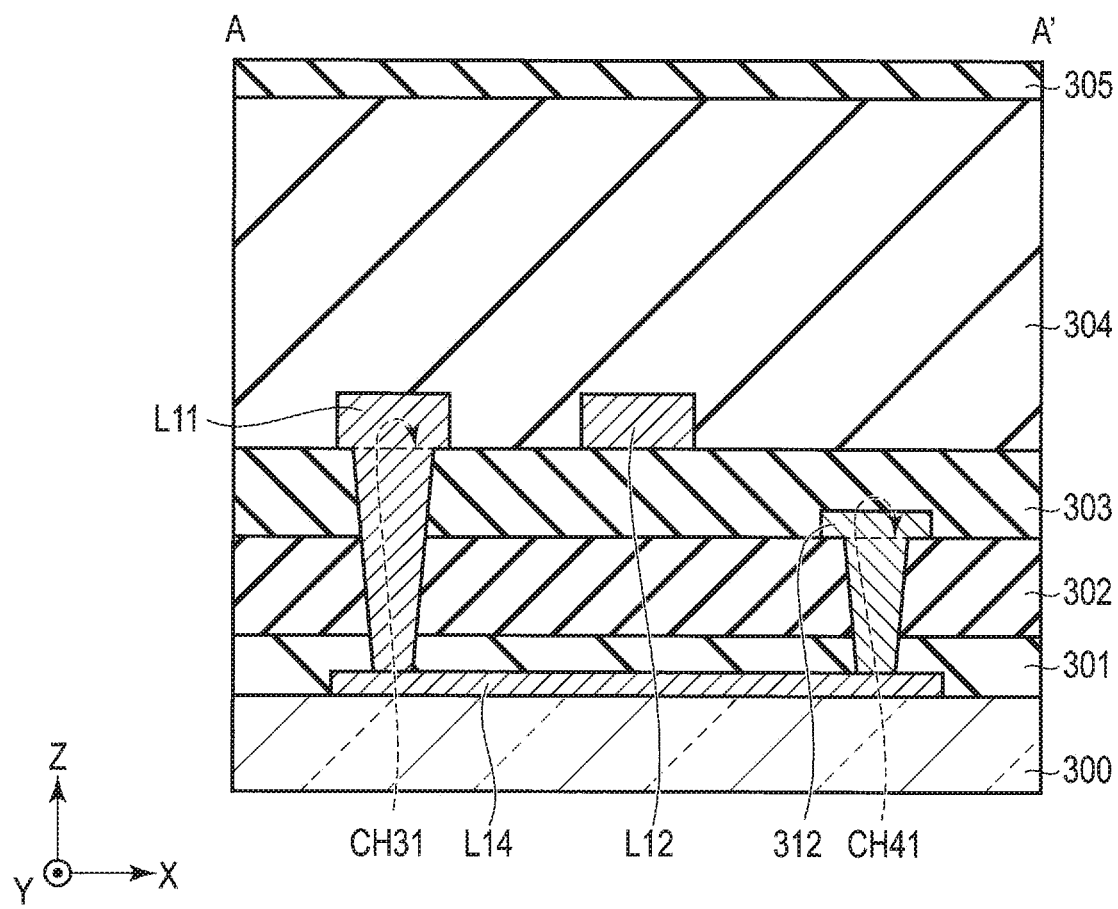
FIG. 5 is a cross section taken along line A-A' shown in FIG. 4.

FIG. 5B is a cross section taken along line A-A' shown in FIG. 4. The wiring line L14 is located on the substrate 300, and is covered by the insulating film 301. The gate electrode 312 is brought into contact with the wiring line L14 in the contact hole CH41 which penetrates the insulating films 301 and 302. Thus, the wiring line L14 and the gate electrode 312 are at the same potential. The wiring lines L14 can be formed, for example, from the same material and by the same process as those of the gate electrode 322 of the transistor 32.

The wiring line L11 and the wiring line L12 are located on the insulating film 303, and are covered by the insulating film 304. The wiring line L11 is in contact with the wiring line L14 in the contact hole CH31 which penetrates the insulating films 301, 302 and 303. With this structure, the gate potential supplied from the wiring line L11 is supplied to the gate electrode 312 via the wiring line L14. Note that the cross section taken along line B-B' shown in FIG. 4 is similar to that of the cross section of the transistor 31 shown in FIG. 3.

Figure 6:
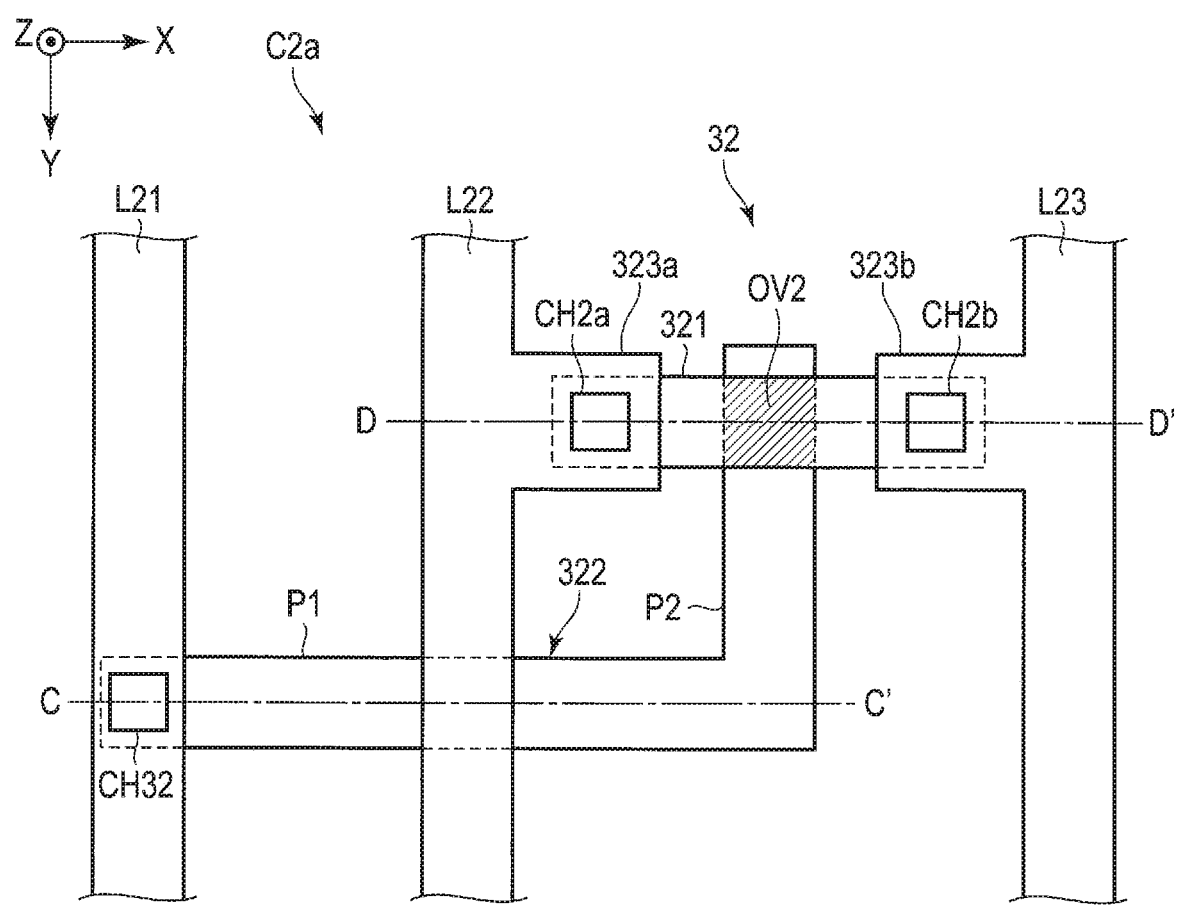
FIG. 6 is a plan view of the selection circuit C2a shown in FIG. 3.

FIG. 6 is a plan view of the selection circuit C2a shown in FIG. 3. In the example illustrated, the selection circuit C2a comprises, in addition to the transistor 32, wiring lines L21, L22 and L23. For example, the wiring lines L21, L22 and L23 each extend along the second direction Y, and are arranged along the first direction X in this order.

The structure of the transistor 32 is similar to that of the transistor 31 except for the structure of the gate electrode 322. To explain, the wiring line L22 and the wiring line L23 comprise convex portions, respectively, which oppose each other. The convex portion of the wiring line L22 projects toward a wiring line L23 side, and forms the electrode 323a. The convex portion of the wiring line L23 projects toward a wiring line L22 side, and forms the electrode 323b. The semiconductor layer 321 has a rectangular shape comprising long sides along the first direction X, and overlaps each of the electrodes 323a and 323b in their end portions, respectively. The contact hole CH2a is provided in a region where the semiconductor layer 321 and the electrode 323a overlap each other. The contact hole CH2b is provided in a region where the semiconductor layer 321 and the electrode 323b overlap each other.

The gate electrode 322 comprises a first portion P1 extending along the first direction X, and a second portion P2 extending along the second direction Y. In the example illustrated, the first portion P1 intersects the wiring line L22. One end portion of the first portion P1 is located directly under the wiring line L21. The other end portion of the first portion P1 is located between the wiring line L22 and the wiring line L23. The second portion P2 extends from the other end portion of the first portion P1, and intersects the semiconductor layer 321. In the example illustrated, the second portion P2 overlaps approximately the center of the semiconductor layer 321. The gate electrode 322 is electrically connected to the wiring line L21 in the contact hole CH32 provided in a region where the first portion P1 and the wiring lines L21 overlap each other.

In this embodiment, a unit capacitance (second unit capacitance) UC2 of the transistor 32 is defined as a capacitance per unit area of a region OV2 where the gate electrode 322 and the semiconductor layer 321 overlap each other in plan view. In FIG. 6, the region OV2 is indicated as a region diagonally shaded.

Figure 7:
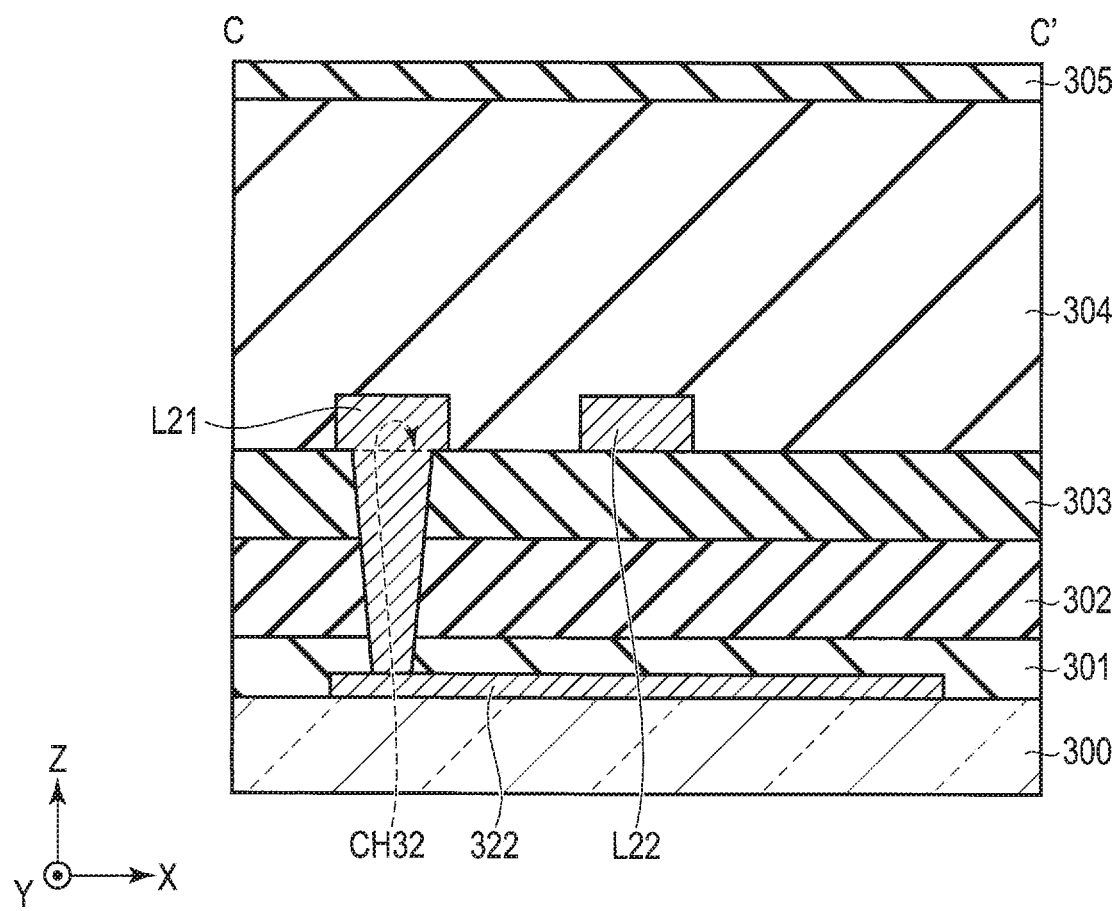
FIG. 7 is a cross section taken along line C-C' shown in FIG. 6.

FIG. 7 is a cross section taken along line C-C' shown in FIG. 6. The wiring line L21 and the wiring line L22 are located on the insulating film 303, and are covered by the insulating film 304. The wiring line L21 is in contact with the gate electrode 322 via the contact hole CH32 which penetrates the insulating films 301, 302 and 303. Thus, the gate potential supplied from the wiring line L11 is supplied to the gate electrode 322. Note that the cross section taken along line D-D' shown in FIG. 6 is similar to that of the cross section of the transistor 32 shown in FIG. 3.

FIG. 8 is a plan view schematically showing an example of arrangement of the detection electrode Rx and the drive electrode Tx shown in FIG. 2. The detection electrode Rx extends along the second direction Y while bending. More specifically, the detection electrode Rx comprises bent portions B1 projecting toward the first direction X, and bent portions B2 projecting toward a direction opposite to the first direction X. In the second direction Y, the bent portions B1 and bent portions B2 are arranged alternately. For example, the detection electrodes Rx are formed into a linear shape, respectively, between the bent portions B1 and bent portions B2. Moreover, in each adjacent pair of detection electrodes Rx along the first direction X, the locations of the bent portions B1 along the second direction Y and those of the bent portions B2 along the second direction Y coincide with each other, respectively.

The drive electrodes Tx are arranged along the first direction X and the second direction Y at intervals. For example, the drive electrodes Tx are formed into substantially a parallelogram shape. The drive electrodes Tx each comprise a side ET1 and a side ET2 extending along directions crossing each other. The side ET1 extends along the first direction X. The side ET2 opposes the detection electrodes Rx, and extends parallel to the detection electrodes Rx. Each detection electrode Rx is located respectively between the sides ET2 of each respective adjacent pair of drive electrodes Tx along the first direction X.

Each respective adjacent pair of drive electrodes Tx along the first direction X are connected to each other by a respective relay electrode RE. The relay electrodes RE go under the detection electrodes Rx. The relay electrodes RE are formed, for example, under the detection electrodes Rx. The relay electrodes RE are insulated from the detection electrodes Rx by an insulating film (not shown). In the example illustrated, the positions of two relay electrodes RE connected to one drive electrode Tx are different from each other. In other words, in the vicinities of diagonal corners of each substantially parallelogram-shaped drive electrode Tx, the respective drive electrodes Tx and the respective relay electrodes RE are connected to each other. Such arrangement can suppress occurrence of moire caused by reflection light reflected by the detection electrodes Rx, the drive electrodes Tx, the relay electrodes RE.

Figure 9:
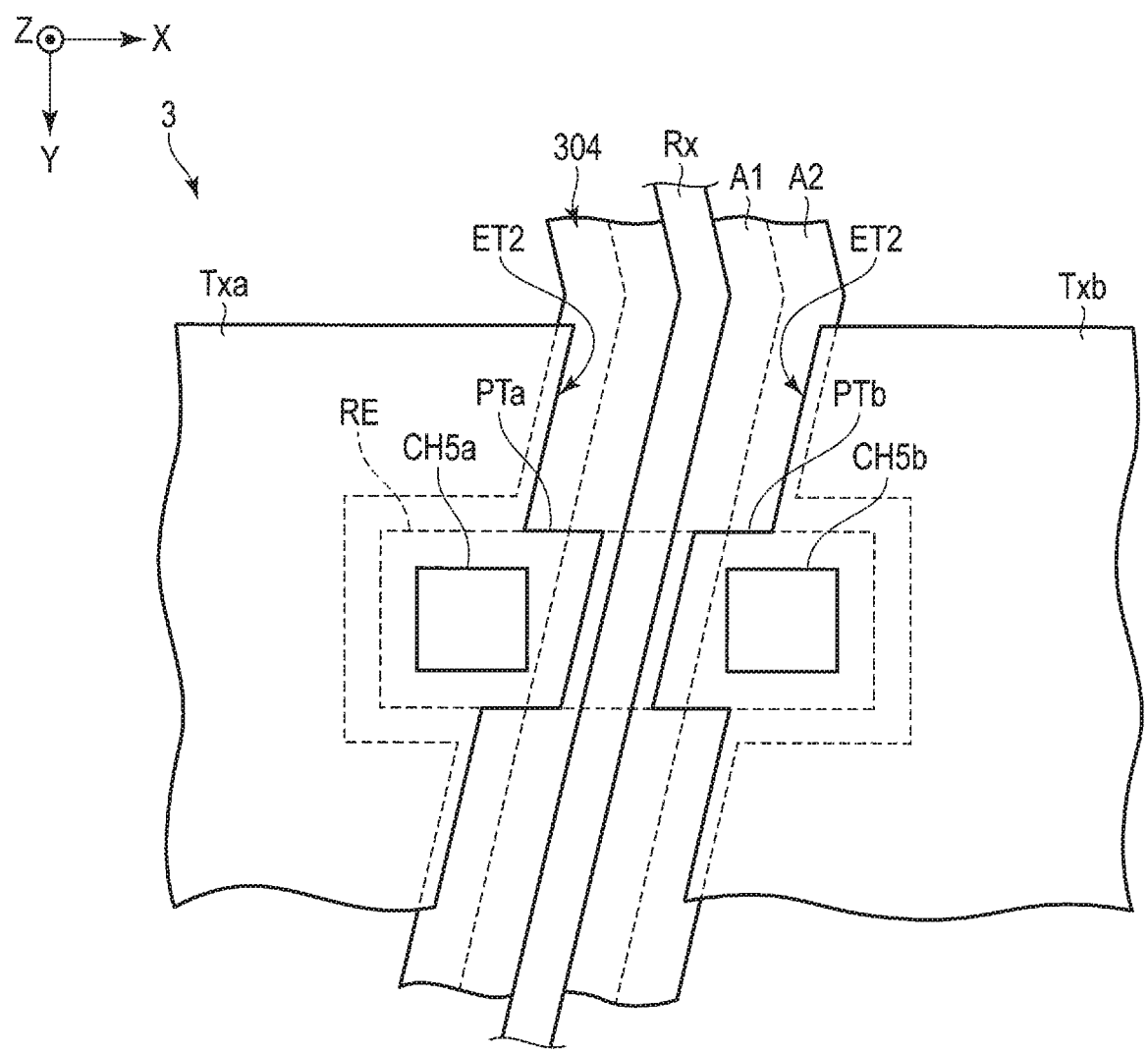
FIG. 9 is an expanded plan view showing a vicinity of a relay electrode RE shown in FIG. 8.

FIG. 9 is an expanded plan view showing the vicinity of a relay electrode RE shown in FIG. 8. FIG. 9 shows a relay electrode RE, drive electrodes Tx (Txa, Txb), and a detection electrode Rx, in addition to the insulating film 304. The insulating film 304 is formed from the same material as that of the insulating film 304 shown in FIG. 3.

The relay electrode RE has, for example, a rectangular shape comprising long sides along the first direction X. Both ends of the relay electrode RE respectively overlap drive electrodes Txa and Txb adjacent to each other along the first direction X. In the example illustrated, the drive electrodes Txa and Txb comprise respective convex portions PTa and PTb opposing each other in a region which overlaps the relay electrode RE. The relay electrode RE and the drive electrode Txa are connected to each other in a contact hole CH5a provided to overlap one end portion of the relay electrode RE. The relay electrode RE and the drive electrode Txb are connected to each other in a contact hole CH5b provided to overlap the other end portion of the relay electrode RE.

The insulating film 304 overlaps all of the detection electrodes Rx and the relay electrodes RE. More specifically, the insulating film 304 is formed into substantially a rectangular shape extending along the detection electrodes Rx, which is slightly greater than the relay electrode RE in a region which overlaps the relay electrode RE. In the third direction Z, the insulating film 304 is interposed between the relay electrodes RE and the detection electrodes Rx to insulate them respectively from each other. Note that it suffices if the insulating film 304 is provided in at least a region where the relay electrodes RE and the detection electrodes Rx respectively overlap each other.

The insulating film 304 comprises, for example, a portion A1 and a portion A2 which are different from each other in thickness. Here, the thickness is defined along the third direction Z. The thickness of the portion A1 is greater than the thickness of the portion A2. The portion A1 is located directly under and along the detection electrode Rx. The portion A2 is located on an outer side of the portion A1. In the example illustrated, the detection electrode Rx is disposed in a substantially center of the portion A1 along the first direction X. Of the drive electrodes Txa and Txb, the sides ET2 opposing the detection electrode Rx each overlap the portion A2. Of the drive electrodes Txa and Txb, the convex portions PTa and PTb each partially overlap the portion A1.

Figure 10:
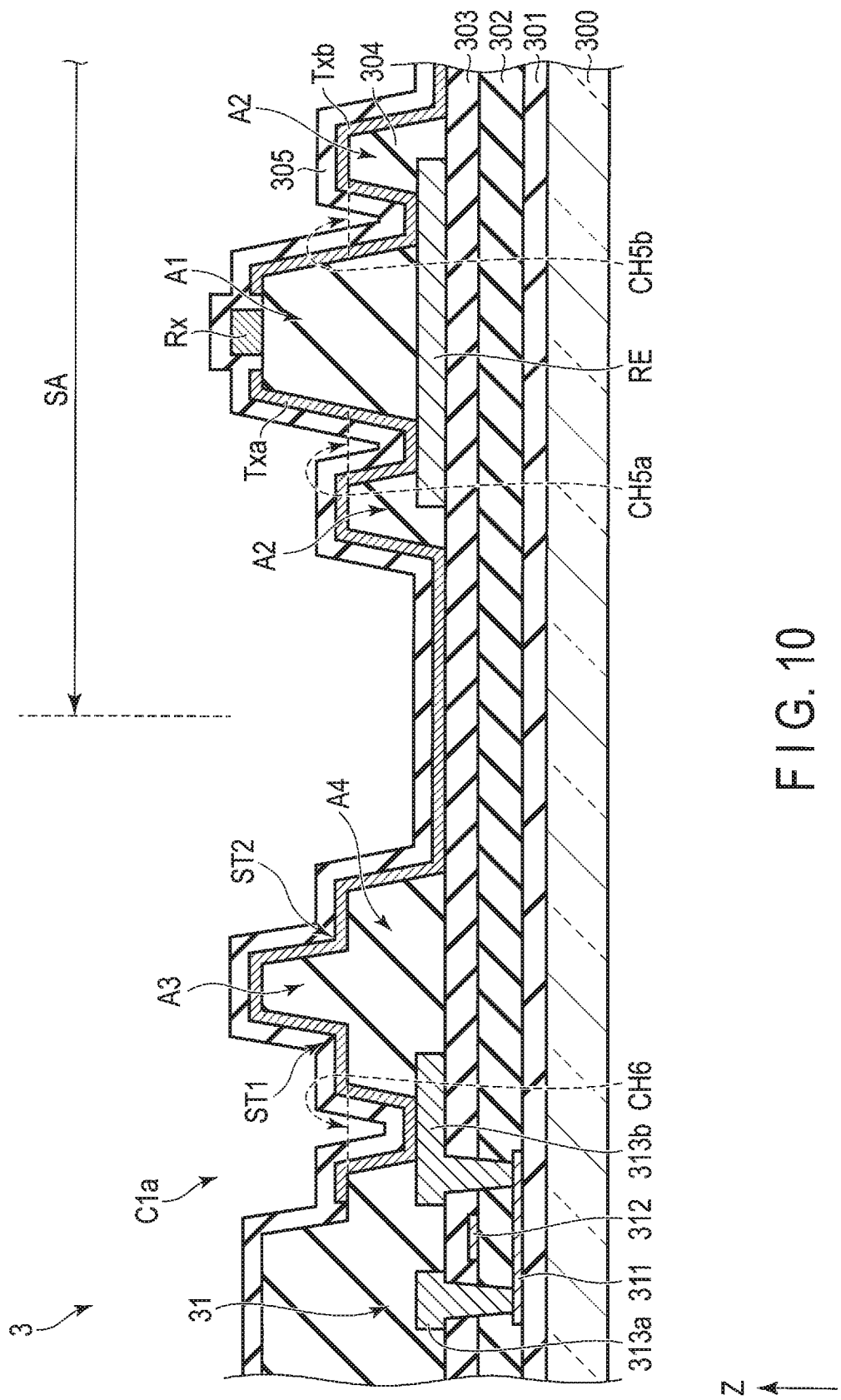
FIG. 10 is a cross section showing how the drive electrode Tx and the buffer circuit C1a are connected each other.

FIG. 10 is a cross section showing how the drive electrode Tx and the buffer circuit C1a are connected to each other. FIG. 10 shows the transistor 31 contained in the buffer circuit C1a, and the drive electrodes Txa and Txb, the detection electrode Rx and the relay electrode RE shown in FIG. 9. The structure of the transistor 31 is similar to that of FIG. 3, and the explanation thereof will be omitted.

In the sensor area SA, the relay electrode RE is located on the insulating film 303, and is covered by the insulating film 304. As described above, in the insulating film 304, the portion A1 is thicker than the portion A2. The detection electrode Rx is formed on the portion A1. The drive electrodes Txa and Txb cover the portion A2 and also extend on the portion A1. On the portion A1, the drive electrodes Txa and Txb are spaced from the detection electrode Rx. The drive electrode Txa is in contact with the relay electrode RE in the contact hole CH5a which penetrates the insulating film 304. The drive electrode Txb is in contact with the relay electrode RE in the contact hole CH5b which penetrates the insulating film 304. Thus, the drive electrode Txa and the drive electrode Txb are electrically connected to each other via the relay electrode RE.

The relay electrode RE and the detection electrode Rx are each formed from, for example, a metal material such as aluminum, titanium, silver, molybdenum, tungsten, copper or chromium, or an alloy of a combination of any of these metal materials. The relay electrodes RE and the detection electrodes Rx each may be of a single- or multi-layer structure. Note that the relay electrodes RE can be formed from the same material and by the same process as those of the electrodes 313a and 313b of the transistor 31. The drive electrodes Tx are each formed of a transparent conductive material such as indium tin oxide (ITO) or indium zinc oxide (IZO).

The drive electrodes Txa each extend out of the sensor area SA, and are connected to the transistor 31. For example, the drive electrode Txa is in contact with the electrode 313b of the transistor 31 in a contact hole CH6 which penetrates the insulating film 304. In the example illustrated, the portion of the insulating film 304, which covers the electrodes 313a and 313b is not connected with the portion of the insulating film 304, which covers the relay electrode RE. In other words, the drive electrode Txa is in contact with the insulating film 303 between the electrode 313b and the relay electrode RE.

In this embodiment, the insulating film 304 which covers the electrodes 313a and 313b comprises a portion A3 and a portion A4 which are different in thickness. The portion A3 is thicker than the portion A4. In other words, the insulating film 304 comprises stepped portions ST1 and ST2 formed by the portion A3 and the portion A4. With the stepped portions ST1 and ST2 formed as such, breaking and the like of the drive electrode Txa formed on the insulating film 304 can be inhibited. Note that by adjusting the light exposure during the photolithography being carried out, the portion A3 and the portion A4 can be formed at the same time as the portions A1 and A2 as they are formed.

According to this embodiment, in the detection device 3 comprising the transistor 31 and the transistor 32, which are different from each other in drive voltage, the unit capacitance UC1 of the transistor 31 and the unit capacitance UC2 of the transistor 32 are independently controlled. More specifically, the insulating film 301 which functions as a gate insulating film of the transistor 32 is formed on a lower side and the insulating film 302 which functions a gate insulating film of the transistor 31 is formed on an upper side, while interposing the semiconductor layers 311 and 321 therebetween. With such structure, the thickness T1 of the insulating film 301 and the thickness T2 of the insulating film 302 can be set independently. That is, the distance D1 between the gate electrode 312 and the semiconductor layer 311 in the transistor 31 and the distance D2 between the gate electrode 322 and the semiconductor layer 321 in the transistor 32 can be set independently. As a result, the unit capacitance UC1 and the unit capacitance UC2 can be independently controlled.

In this embodiment, the thickness T2 is set greater than the thickness T1, and thus the unit capacitance UC1 of the transistor 31 is less than the unit capacitance UC2 of the transistor 32. The unit capacitance UC1 is small, destruction of the insulating film 302 can be inhibited even if, for example, the drive voltage (the inter-gate sauce voltage Vgs1) of the transistor 31 is higher than the drive voltage (the inter-gate sauce voltage Vgs2) of the transistor 32. That is, the withstand voltage of the transistor 31 can be set higher than the withstand voltage of the transistor 32.

On the other hand, generally, since the ON-state current of a transistor decreases as the gate insulating film is thicker, the size of the transistor is increased, in many cases, to obtain a desired ON-state current. In this case, it becomes difficult to improve the integration of peripheral circuits higher and therefore the narrowing of the region where the peripheral circuits are disposed, that is the frame region other than the sensor region, may be undesirably interfered with. However, according to this embodiment, in the transistor 32 with low drive voltage, the thickness T1 of the insulating film 301, which is a gate insulating film, can be set to an optimal value regardless of the thickness T2 of the insulating film 302. Therefore, a desired ON-state current can be obtained without enlarging the transistor 32. The narrowing of the frame can be achieved.

As described above, according to the first embodiment, a detection device with a narrow frame can be provided while maintaining the withstand voltage of the thin film transistor.

Next, another example of the first embodiment will be described with reference to FIGS. 11 to 18.

Figure 11:
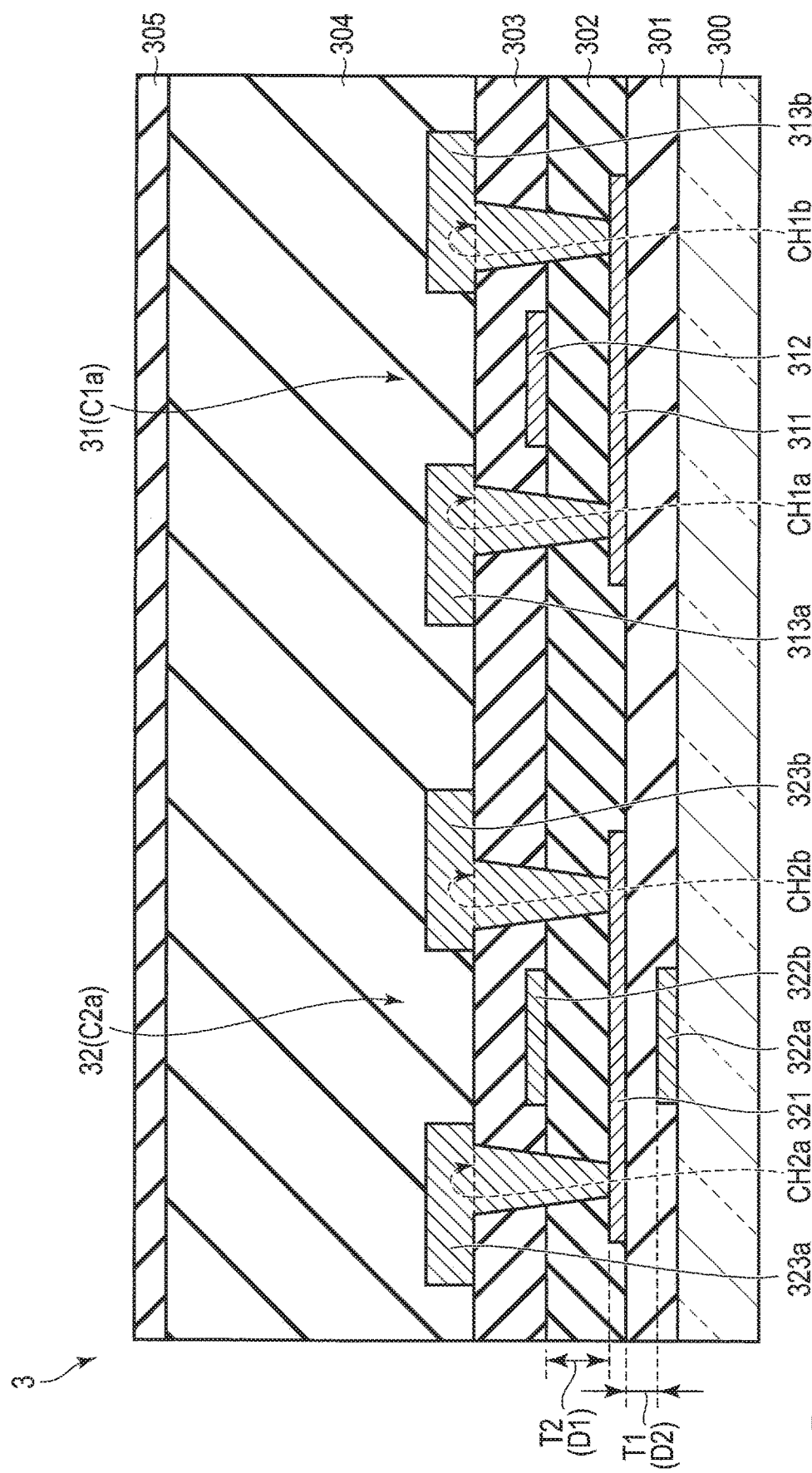
FIG. 11 shows a comparative example of the first embodiment.

FIG. 11 is a cross section of another example of the first embodiment. The example shown in FIG. 11 is different from that of FIG. 3 in that the transistor 32 comprises two gate electrodes 322a and 322b. The gate electrode 322a and the gate electrode 322b oppose each other while interposing the semiconductor layer 321 therebetween. The gate electrode 322a is located on the substrate 300, and is covered by the insulating film 301. The gate electrode 322b is located on the insulating film 302, and is covered by the insulating film 303. In other words, the gate electrode 322b opposes the semiconductor layer 321 via the insulating film 302. For example, the gate electrode 322b is formed from the same material as that of the gate electrode 312 of the transistor 31. In the example shown in FIG. 11 as well, the thickness T2 of the insulating film 302 is greater than the thickness T1 of the insulating film 301.

Figure 12:
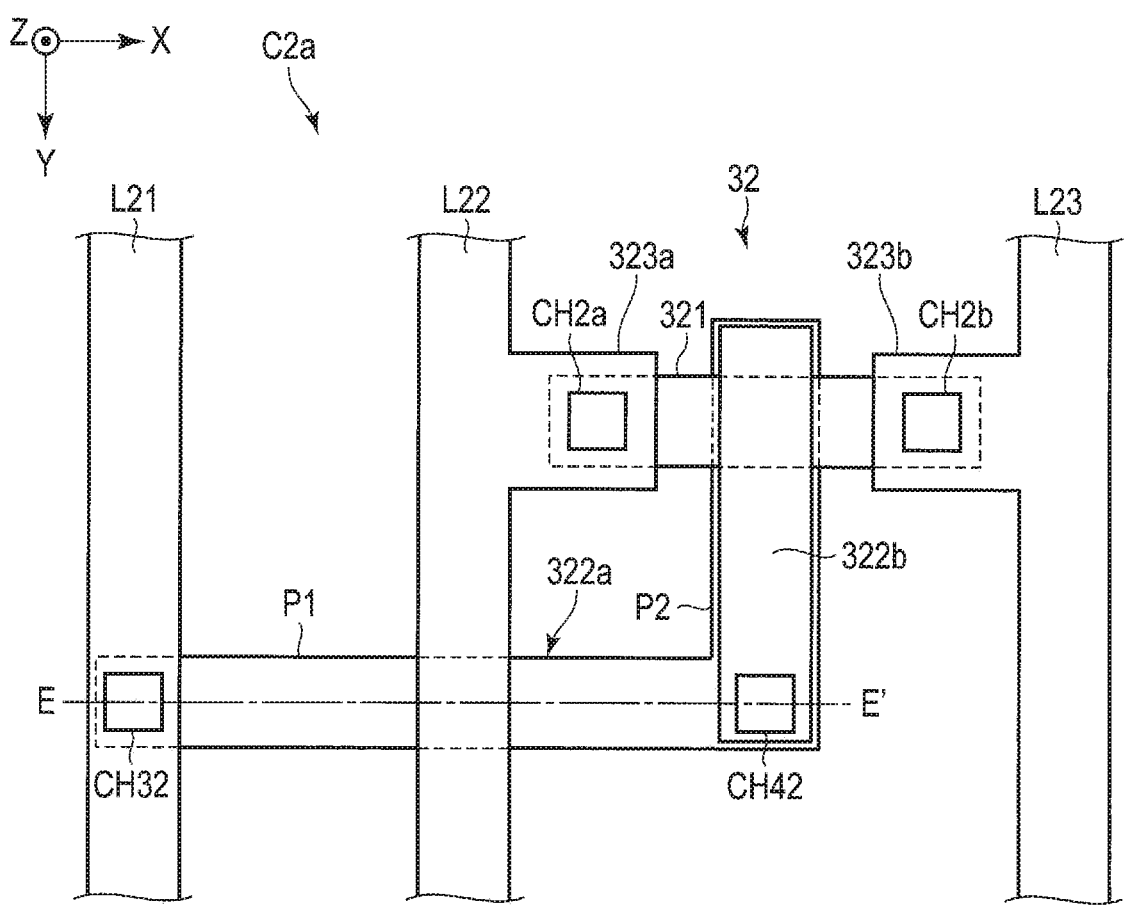
FIG. 12 is a plan view of the selection circuit C2a shown in FIG. 11.

FIG. 12 is a plan view of a selection circuit C2a shown in FIG. 11. The gate electrode 322a has a structure similar to that of the gate electrode 322 shown in FIG. 6. That is, the gate electrode 322a comprises a first portion P1 extending along the first direction X, and a second portion P2 extending along the second direction. The first portion P1 extends towards between the wiring line L22 and the wiring lines L23 from directly below the wiring lines L21, and intersects the wiring line L22. The second portion P2 extends from the first portion P1 between the wiring line L22 and the wiring line L23, and intersects the semiconductor layer 321.

The gate electrode 322b is located right above the second portion P2. In the example illustrated, the gate electrode 322b has the same shape and substantially the same size as those of the second portions P2. The gate electrode 322b is connected with the gate electrode 322a in a contact hole CH42 provided in a region which overlaps one end on a first portion P1 side.

Figure 13:
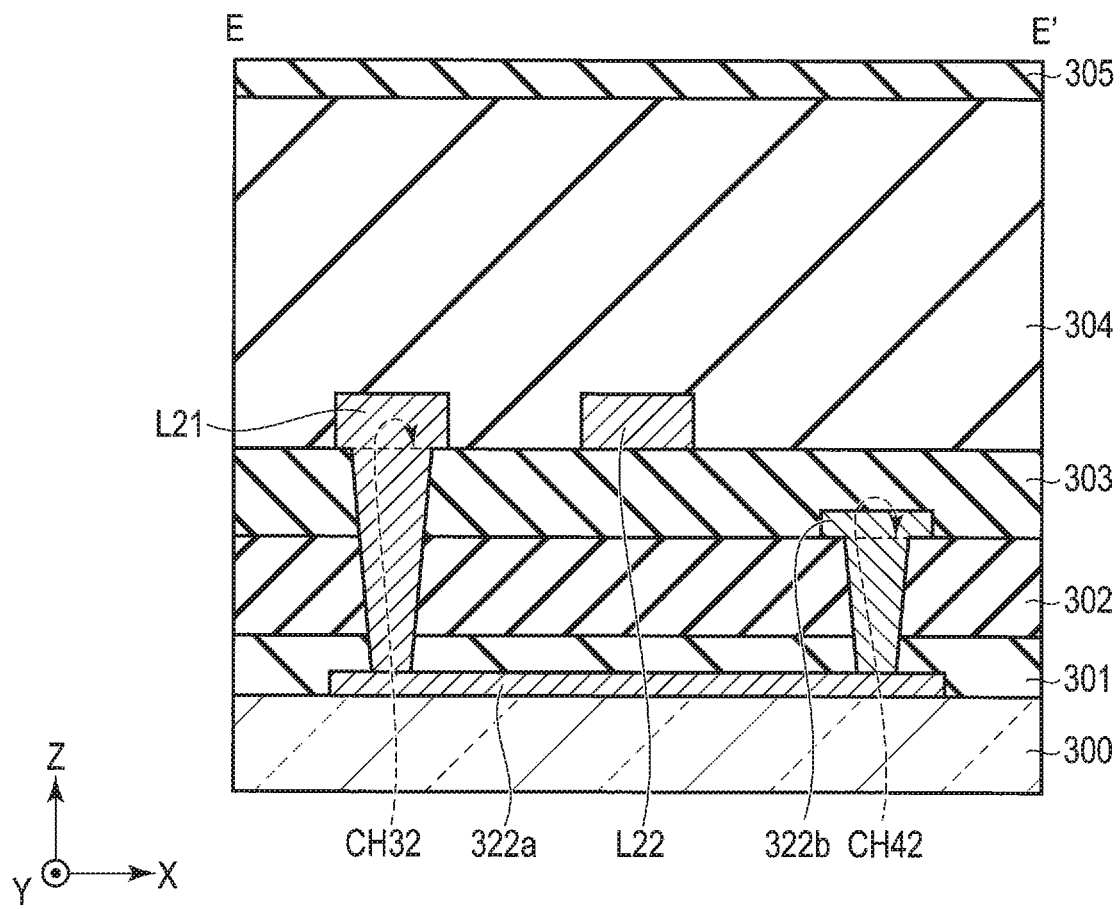
FIG. 13 is a cross section taken along line E-E' shown in FIG. 12.

FIG. 13 is a cross section taken along line E-E' shown in FIG. 12. The gate electrode 322b is in contact with the gate electrode 322a in the contact hole CH42 which penetrates the insulating films 301 and 302. Thus, the gate electrode 322b and the gate electrode 322a are at the same potential.

In the example shown in FIGS. 11 to 13, the semiconductor layers 311 and 321 are formed between the insulating film 301 and the insulating film 302, and the thickness T2 of the insulating film 302 is greater than the thickness T1 of the insulating film 301. That is, the distance D1 between the gate electrode 312 and the semiconductor layer 311 in the transistor 31 is greater than the distance D2 between the gate electrode 322 and the semiconductor layer 321 in the transistor 32. As a result, a detection device with a narrowed frame can be obtained while maintaining the withstand voltage of the thin film transistor.

Further, in the transistor 32 driven by low voltage, voltage can be applied to the semiconductor layer 321 from both sides of the gate electrode 322a and the gate electrode 322b, the characteristics of the transistor 32 can be improved. Moreover, the gate electrode 322b is disposed on a side of the insulating film 304 formed of an organic insulating material, and with this structure, the effect of shutting down the electric field formed from ions contained in the insulating film 304 can be obtained. That is, the effect of the electric field formed from the ions, on the semiconductor layer 321 can be inhibited, and the characteristics of the transistor 32 can be improved.

FIG. 14 is a cross section showing another example of the first embodiment. The example shown in FIG. 14 is different from that of FIG. 11 in that the gate electrode 322b of the transistor 32 is located on the insulating film 303. The gate electrode 322b is covered by the insulating film 304. For example, the gate electrode 322b is formed from the same material as that of the electrodes 323a and 323b.

Figure 15:
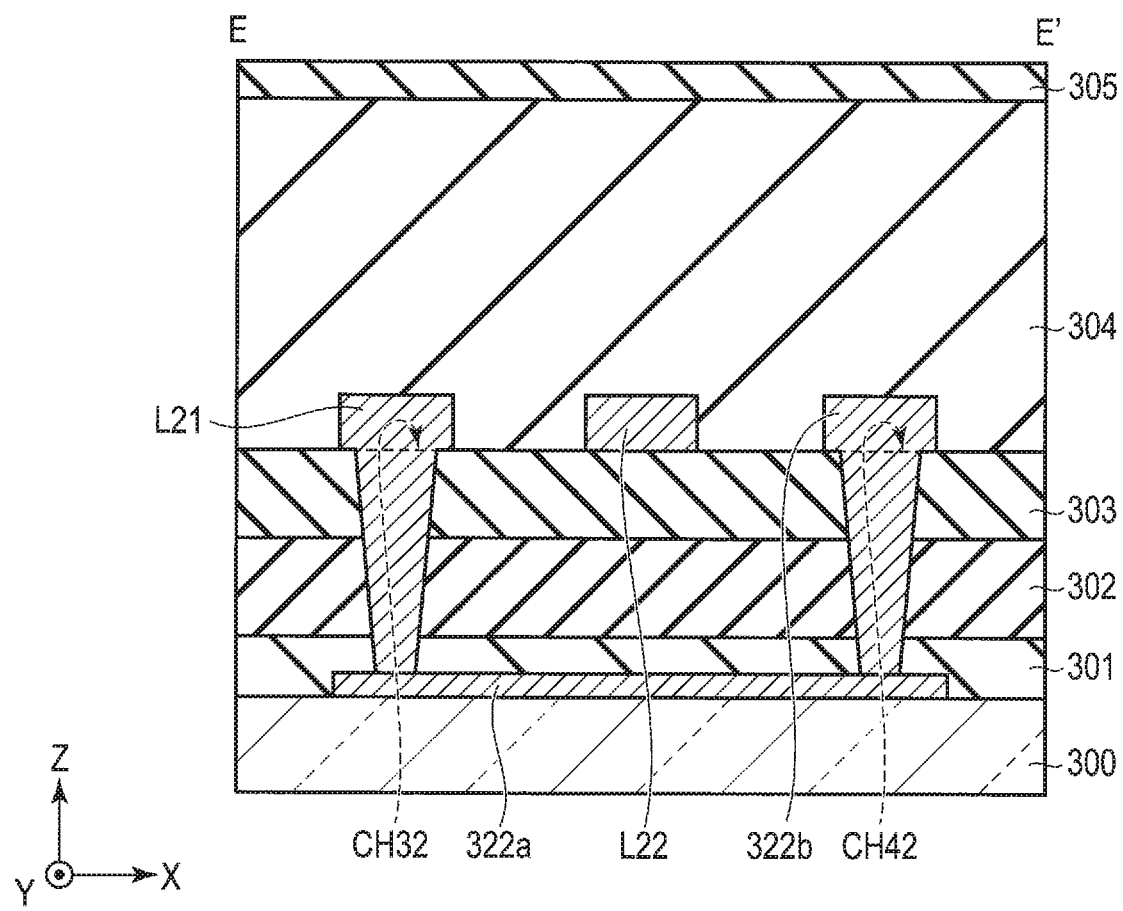
FIG. 15 is a cross section showing how a gate electrode 322a and a gate electrode 322b shown in FIG. 14 are connected to each other.

FIG. 15 is a cross section showing how the gate electrode 322a and the gate electrode 322b shown in FIG. 14 are connected to each other. FIG. 15 is equivalent to the cross section taken along line E-E' shown in FIG. 12. The gate electrode 322b is in contact with the gate electrode 322a in the contact hole CH42 which penetrates the insulating films 301, 302 and 303. Thus, the gate electrode 322a and the gate electrode 322b are at the same potential. The example shown in FIGS. 14 and 15 exhibits an effect similar to that of the example of FIGS. 11 to 13.

Figure 16:
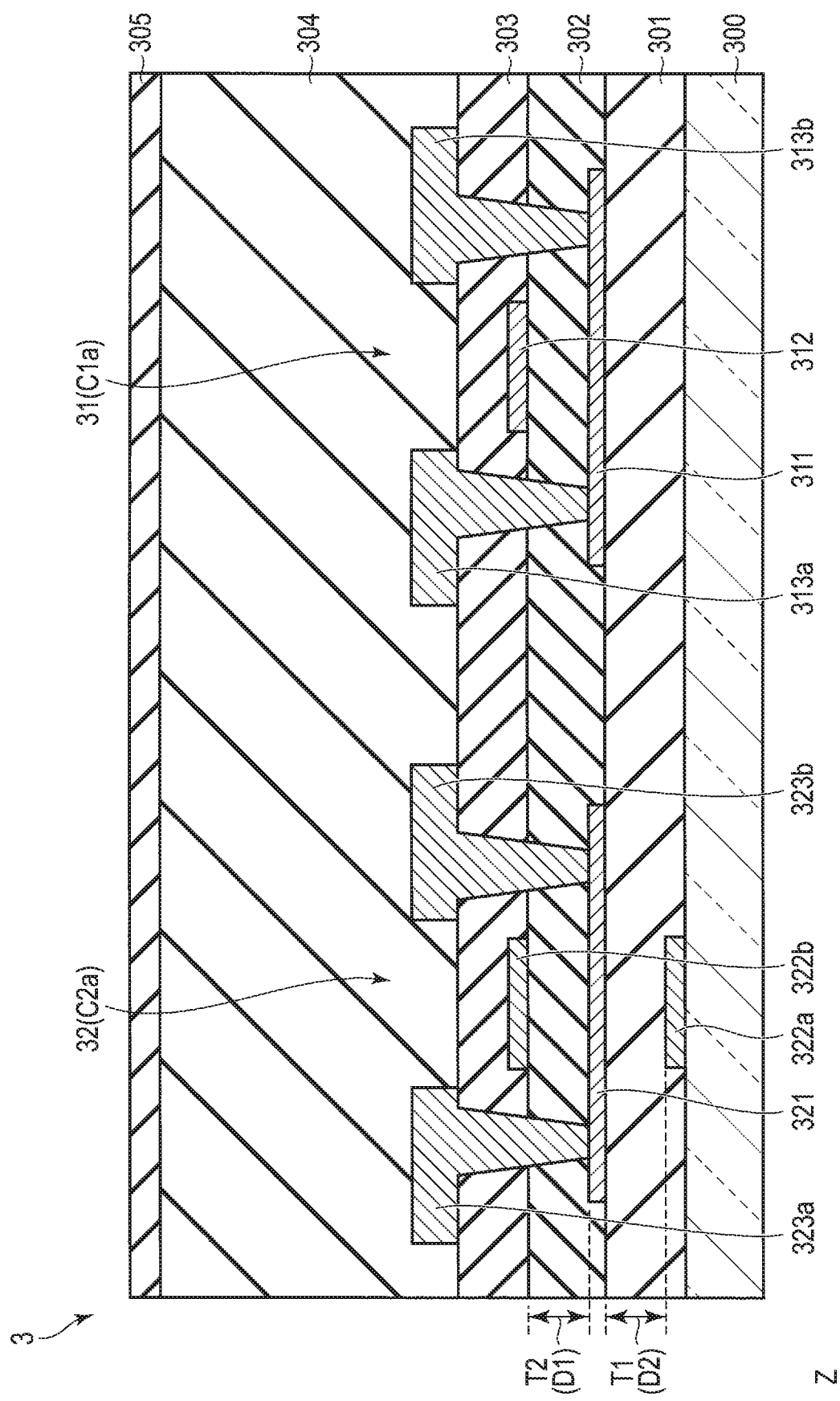
FIG. 16 shows another example of the first embodiment.

FIG. 16 is a cross section of another example of the first embodiment. The example shown in FIG. 16 is different from that of FIG. 11 in that the thickness T1 of the insulating film 301 and the thickness T2 of the insulating film 302 are equal to each other. In the example shown in FIG. 16, the insulating film 301 and the insulating film 302 are formed from materials different from each other. A relative permittivity $\epsilon 2$ of the insulating film 302 is lower than a relative permittivity $\epsilon 1$ of the insulating film 301. Therefore, even if the thickness T1 and the thickness T2 are equal to each other, the unit capacitance UC1 of the transistor 31 is less than the unit capacitance UC2 of the transistor 32.

In the example shown in FIG. 16, the insulating film 301 which functions as a gate insulating film of the transistor 32 is formed on a lower side and the insulating film 302 which functions a gate insulating film of the transistor 31 is formed on an upper side, while interposing the semiconductor layers 311 and 321 therebetween. With such structure, the insulating film 301 and the insulating film 302 can be formed from materials different from each other. That is, the relative permittivity $\epsilon 1$ of the insulating film 301 and the relative permittivity $\epsilon 2$ of the insulating film 302 can be set independently.

For example, in the transistor 31, the unit capacitance UC1 can be reduced by lowering the relative permittivity $\epsilon 2$ of the insulating film 302. As a result, even if the drive voltage of the transistor 31 is high, the breaking down of the insulating film 302 can be inhibited and the withstand voltage of the transistor 31 can be raised. On the other hand, in the transistor 32, the unit capacitance UC2 can be increased by raising the relative permittivity ci of the insulating film 301. As a result, in the transistor 32 with low drive voltage, a desired ON-state current can be obtained without enlarging the size of the transistor.

As described above, in the example shown in FIG. 16 as well, the relative permittivities $\epsilon 1$ and $\epsilon 2$ of the insulating films 302 and 301 are set to appropriate values, respectively, according to the drive voltages of the transistors 31 and 32, the withstand voltage of the thin film transistor can be maintained, and a detection device with a narrowed frame can be provided.

Further, according to the example shown in FIG. 16, in the transistor 32 driven by low voltage, the gate electrode 322b is disposed on an insulating film 304 side. Thus, the gate voltage can be applied from both sides of the upper and lower sides of the semiconductor layer 321, and also the effect of the electric field formed from the ions contained in the insulating film 304 can be inhibited. As a result, the characteristics of the transistor 32 can be improved.

Figure 17:
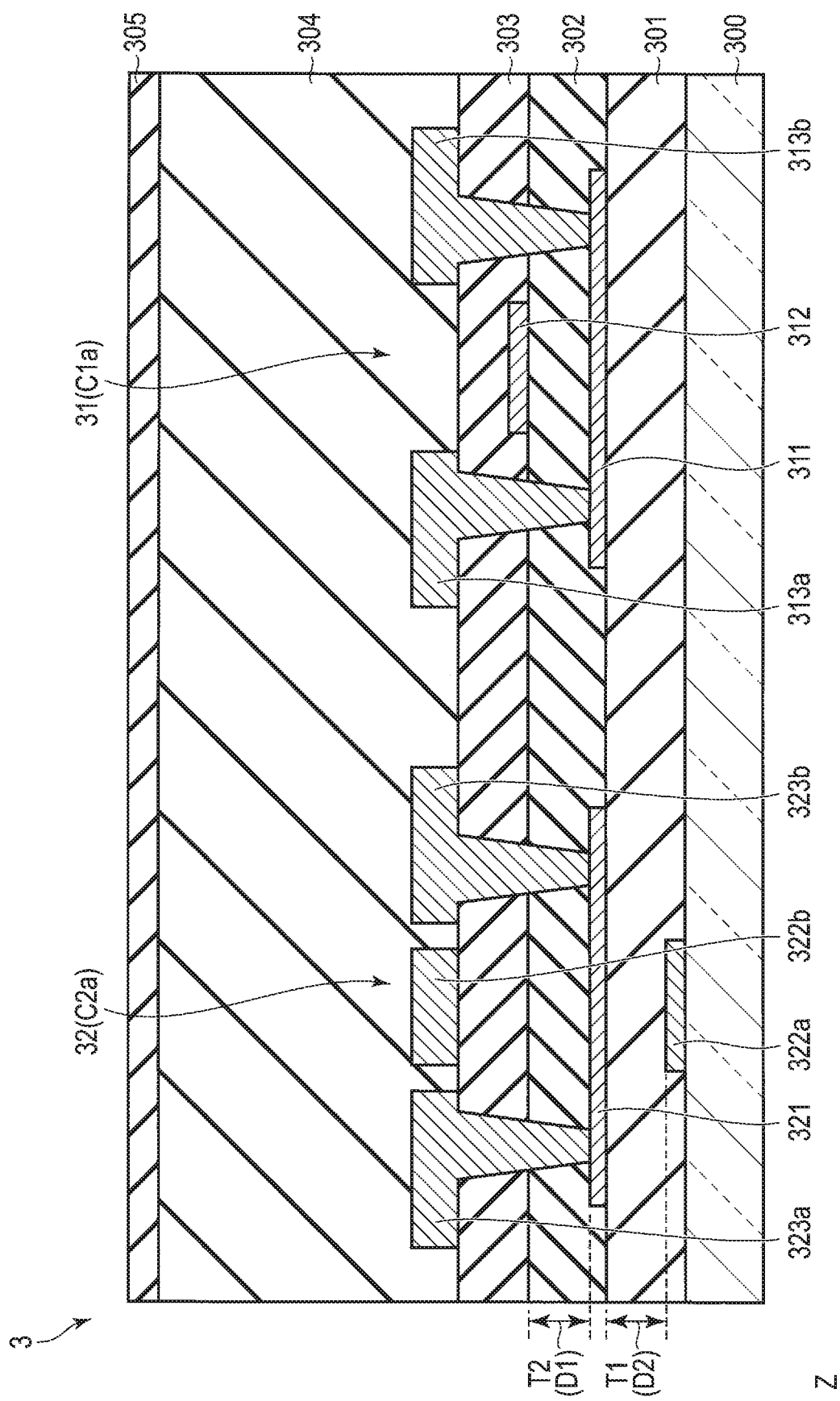
FIG. 17 shows another example of the first embodiment.
Figure 22:
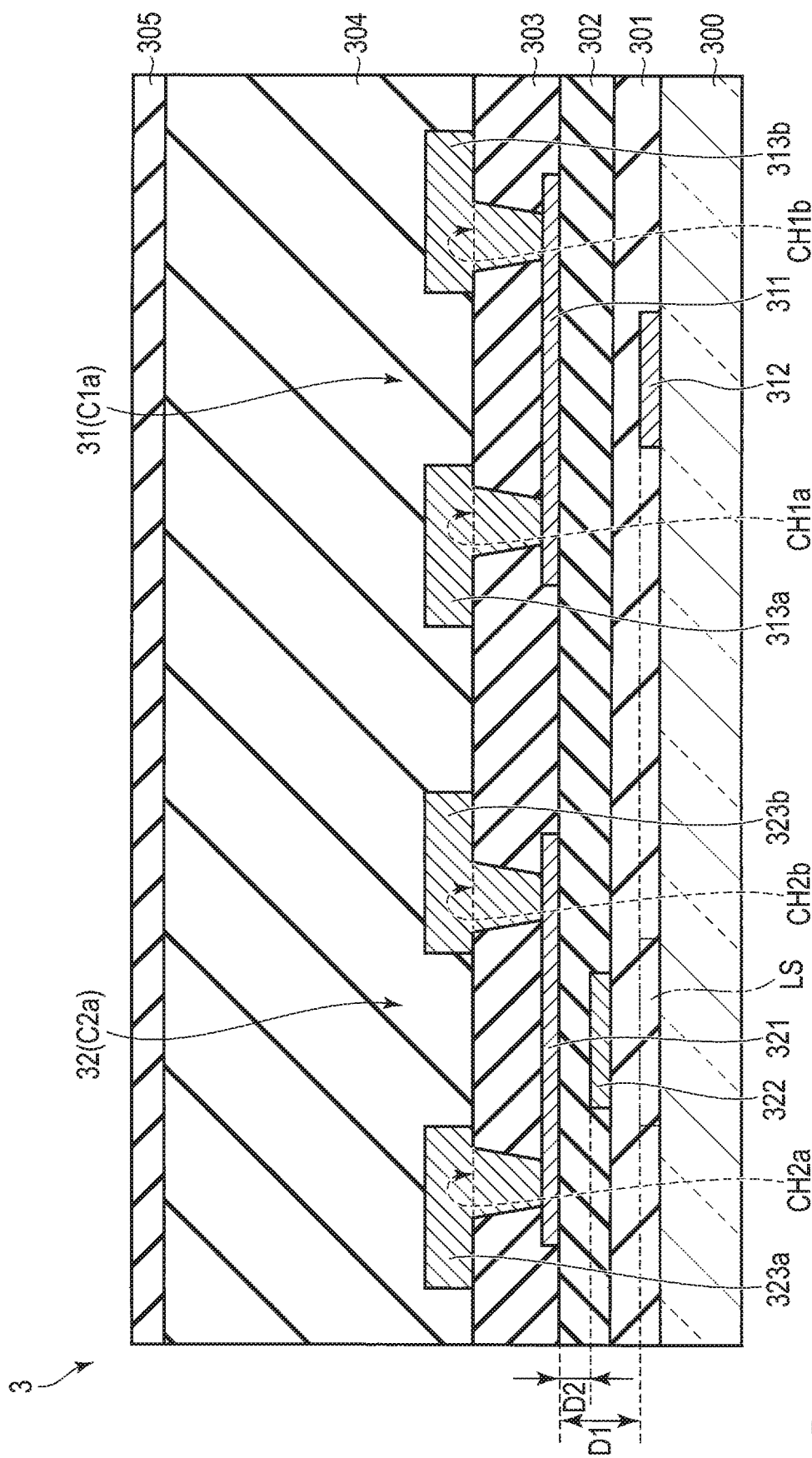
FIG. 22 is a cross section showing a detection device 3 according to the third embodiment.

FIG. 7 is a cross section of another example of the first embodiment. The example shown in FIG. 17 is different from that of FIG. 16 in that the gate electrode 322b of the transistor 32 is located on the insulating film 303. In the example shown in FIG. 17 as well, the relative permittivity $\epsilon 2$ of the insulating film 302 is less than the relative permittivity ci of the insulating film 301. The example shown in FIG. 17 exhibits an effect similar to that of the example of FIG. 16. Note that the gate electrode 322b may be formed into an island-like shape. That is, the potential of the gate electrode 322b may be in a floating state. In this case as well, the effect of shutting down the electric field formed from the ions contained in the insulating film 304 can be obtained, and therefore the characteristics of the transistor 32 can be improved.

FIG. 18 is a cross section showing another example of the first embodiment. The example shown in FIG. 13 is different from that of FIG. 10 in that the insulating films 301, 302 and 303 are not formed in the sensor area SA. That is, the relay electrode RE is in contact with the substrate 300. The insulating film 304 covers the relay electrode RE and is formed on the substrate 300 as well.

In the example illustrated, the insulating films 301, 302 and 303 on a sensor area SA side are partially removed in a region on an outer side of the sensor area SA, that is, in the vicinity of the transistor 31. As a result, in addition to the stepped portions ST1 and ST2 of the insulating film 304, stepped portions ST3 and ST4 are formed in the vicinity of the transistor 31. The stepped portion ST3 is formed by the insulating film 304 and the insulating films 301, 302 and 303. The stepped portion ST4 is formed by the insulating films 301, 302 and 303 and the substrate 300. With the stepped portions ST3 and ST4 thus formed, breaking down of the drive electrode Txa drawn out from the sensor area SA can be inhibited. In the example illustrated, the locations of side surfaces of the insulating films 301, 302 and 303, which form the stepped portion ST4, coincide with each other, but they may differ from each other. In this case, further stepped portions are formed by each of the insulating films 301, 302 and 303.

According to the example shown in FIG. 18, the insulating films 301, 302 and 303 are not provided in the sensor area SA, and therefore the transmissivity of light emitted from the display panel 2 located under the detection device 3 can be improved.

As described above, according to the first embodiment, a detection device with a narrowed frame can be provided while maintaining the withstand voltage of the thin film transistor.

Second Embodiment

FIG. 19 is a cross section showing a detection device according to the second embodiment. The second embodiment is different from the first embodiment in that the transistor 31 is a bottom-gate thin film transistor, and the transistor 32 is a top-gate thin film transistor.

In the transistor 31, the gate electrode 312 is located on the substrate 300, and is covered by the substrate 301. In the transistor 31, the gate electrode 322 is located on the insulating film 302, and is covered by the insulating film 303. The other structures are the same as those of the example shown in FIG. 3 and explanations thereof will be omitted.

In this embodiment, the insulating film 301 functions as a gate insulating film of the transistor 31. The insulating film 302 functions as a gate insulating film of the transistor 32. For example, the insulating film 301 and the insulating film 302 are formed from the same material. The thickness T1 of the insulating film 301 is greater than the thickness T2 of the insulating film 302. In other words, the distance D1 between the gate electrode 312 and the semiconductor layer 311 in the transistor 31 is greater than the distance D2 between the gate electrode 322 and the semiconductor layer 321 in the transistor 32. As a result, the unit capacitance UC1 of the transistor 31 is lower than the unit capacitance UC2 of the transistor 32.

According to this embodiment, the insulating film 301 is provided on a lower side and the insulating film 302 is provided on an upper side while interposing the semiconductor layers 311 and 321 therebetween. The insulating film 301 functions as a gate insulating film of the bottom-gate transistor 31. The insulating film 302 functions as a gate insulating film of the top-gate transistor 32. With such structures, the thickness T1 of the insulating film 301 and the thickness T2 of the insulating film 302 can be set independently. That is, the distance D1 between the gate electrode 312 and the semiconductor layer 311 in the transistor 31 and the distance D2 between the gate electrode 322 and the semiconductor layer 321 in the transistor 32 can be set independently. Therefore, the unit capacitance UC1 and the unit capacitance UC2 are can be independently controlled as in the case of the first embodiment.

According to this embodiment, the unit capacitance UC1 can be decreased by increasing the thickness T1. Thus, even if the drive voltage of the transistor 31 is large, the breaking down of the insulating film 301 can be controlled and the withstand voltage of the transistor 31 can be increased. On the other hand, the unit capacitance UC2 can be increased by decreasing the thickness T2. As a result, a desired ON-state current can be obtained without increasing the transistor 32, and the narrowing of the frame can be realized.

As described above, in the second embodiment as well, a detection device with a narrowed frame can be obtained while maintaining the withstand voltage of the thin film transistor.

FIG. 20 is a cross section of another example of the second embodiment. The example shown in FIG. 20 is different from that of FIG. 19 in that the transistor 32 comprises two gate electrodes 322a and 322b.

The gate electrode 322a and the gate electrode 322b oppose each other while interposing the semiconductor layer 321 therebetween. The gate electrode 322b is located on the substrate 300, and is covered by the insulating film 301. In other words, the gate electrode 322b opposes the semiconductor layer 321 via the insulating film 301. The gate electrode 322a is located on the insulating film 302, and is covered by the insulating film 303. For example, the gate electrode 322b is formed from the same material as that of the gate electrode 312 of the transistor 31. The thickness T1 of the insulating film 301 is greater than the thickness T2 of the insulating film 302.

The example shown in FIG. 20 exhibits an effect similar to that of the example of FIG. 19. Further, in the transistor 32, the gate voltage can be applied from both sides of upper and lower sides of the semiconductor layer 321, and therefore the characteristics of the transistor 32 can be improved.

FIG. 7 is a cross section of another example of the second embodiment. The example shown in FIG. 21 is different from that of FIG. 19 in that the transistor 31 comprises two gate electrodes 312a and 312b.

The gate electrode 312a and the gate electrode 312b oppose each other while interposing the semiconductor layer 321 therebetween. The gate electrode 312a is located on the substrate 300, and is covered by the insulating film 301. The gate electrode 312b is located on the insulating film 302, and is covered by the insulating film 303. For example, the gate electrode 312b is formed from the same material as that of the electrodes 313a and 313b of the transistor 31. The thickness T1 of the insulating film 301 is greater than the thickness T2 of the insulating film 302.

The example shown in FIG. 21 exhibits an effect similar to that of the example of FIG. 19. Further, in the transistor 31, the gate electrode 312b is disposed on an insulating film 304 side, and thus the effect of the electric field formed from ions contained in the insulating film 304 can be suppressed, and also the gate voltage can be applied from both of the upper and lower sides of the semiconductor layer 321. As a result, the characteristics of the transistor 32 can be improved.

As described above, in the second embodiment as well, a detection device with a narrowed frame can be obtained while maintaining the withstand voltage of the thin film transistor.

Third Embodiment

FIG. 17 is a cross section showing a detection device 3 according to the third embodiment. The third embodiment is different from the first embodiment or second embodiment in that both of the transistor 31 and the transistor 32 are bottom-gate thin film transistors, and two layers, namely, the insulating films 301 and 302 are formed under the semiconductor layer 311 and the semiconductor layer 321.

The gate electrode 312 is provided on the substrate 300. The gate electrode 322 is formed on the insulating film 301. On the other hand, the semiconductor layers 311 and 321 are both located on the insulating film 303. In other words, the gate electrode 312 opposes the semiconductor layer 311 via the insulating film 301 and the insulating film 302, and the gate electrode 322 opposes the semiconductor layer 321 via the insulating film 302. Therefore, the distance D1 between the gate electrode 312 and the semiconductor layer 311 in the transistor 31 is greater than the distance D2 between the gate electrode 322 and the semiconductor layer 321 in the transistor 32.

In the above-described structure, the insulating films 301 and 302 function as gate insulating films of the transistor 31. The insulating film 302 functions as a gate insulating film of the transistor 32. In the example illustrated, the thickness of the insulating film 301 and that of the insulating film 302 are substantially equal to each other, but they may differ.

Note that as indicated by an alternate long and two short dashes line shown in the figure, a light-shielding layer LS may be provided directly under the transistor 32. The light-shielding layer LS is located directly under the gate electrode 322 via the insulating film 301. The light-shielding layer LS as such can be formed by the same process and the same material from as those of the gate electrode 312 of the transistor 31.

According to this embodiment, with the insulating films 301 and 302 provided under the semiconductor layers 311 and 321, the distance D1 between the gate electrode 312 and the semiconductor layer 311 and the distance D2 between the gate electrode 322 and the semiconductor layer 321 can be set independently even if both of the transistor 31 and the transistor 32 are of the bottom-gate type. As a result, by setting the distance D1 greater than the distance D2, the withstand voltage of the transistor 31 can be made larger than the withstand voltage of the transistor 32. On the other hand, by decreasing the distance D1, a desired ON-state current can be obtained without enlarging the transistor 32, and thus the narrowing of the frame can be realized.

Therefore, in the third embodiment, a detection device with a narrowed frame can be obtained while maintaining the withstand voltage of the thin film transistor. The third embodiment is described in connection with an example case where both of the transistors 31 and 32 are of the bottom-gate type. However, even if both of the transistors 31 and 32 are of the top-gate type, an effect similar to the above can be obtained by providing the insulating film 301 and the insulating film 302 above the semiconductor layers 311 and 321, and forming the gate electrode 312 and the gate electrode 322 on different insulating films, respectively.

In each of the above-described embodiments, the transistor 31 is equivalent to the first thin film transistor, and the transistor 32 is equivalent to the second thin film transistor. The semiconductor layer 311 of the transistor 31 is equivalent to the first semiconductor layer, the gate electrode 312 is equivalent to the first gate electrode, and the electrode 313b is equivalent to the first electrode. The semiconductor layer 321 of the transistor 32 is equivalent to the second semiconductor layer, the gate electrodes 322 and 322a are equivalent to the second gate electrode, the gate electrode 322b is equivalent to the third gate electrode, and the electrode 323a is equivalent to the second electrode.

The gate insulating film of the transistor 31 is equivalent to the first insulating film. That is, the insulating film 303 of the first embodiment, the insulating film 301 of the second embodiment, and the insulating films 301 and 302 of the third embodiment are each equivalent to the first insulating film. Similarly, the gate insulating film of the transistor 32 is equivalent to the second insulating film. That is, the insulating film 301 of the first embodiment, the insulating film 302 of the second embodiment, and the insulating film 302 of the third embodiment are each equivalent to the second insulating film. Moreover, the insulating film 304 is equivalent to an organic insulating film.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A detection device comprising:
a substrate;
a drive electrode provided on the substrate;
a detection electrode provided on the substrate and capacitively coupling with the drive electrode;
a first thin film transistor and a second thin film transistor, electrically connected to the drive electrode,
a first insulating film and a second insulating film both stacked on the substrate,
wherein
the first thin film transistor having a withstand voltage higher than a withstand voltage of the second thin film transistor,
the first thin film transistor comprises a first gate electrode and a first semiconductor layer,
the second thin film transistor comprises a second gate electrode and a second semiconductor layer, and
the first semiconductor layer and the second semiconductor layer are in a same layer and are located between the first insulating film and the second insulating film,
the first gate electrode opposes the first semiconductor layer via the first insulating film, and
the second gate electrode opposes the second semiconductor layer via the second insulating film, and
a distance from the first gate electrode to the first semiconductor layer is greater than a distance from the second gate electrode to the second semiconductor layer.

2. The detection device of claim 1, wherein
the first insulating film has a thickness greater than that of the second insulating film.

3. The detection device of claim 1, wherein
the first insulating film has a first relative permittivity and the second insulating film has a second relative permittivity, the first relative permittivity being lower than the second relative permittivity.

4. The detection device of claim 1, wherein
the second thin film transistor further comprises a third gate electrode opposing the second semiconductor layer via at least the first insulating film.

5. The detection device of claim 4, wherein
the third gate electrode is formed of a same material as that of the first gate electrode.

6. The detection device of claim 4, further comprising:
an organic insulating film,
wherein
the first insulating film is provided on the second insulating film,
the organic insulating film is provided on the first insulating film, and
the third gate electrode is provided between the organic insulating film and the first insulating film.

7. The detection device of claim 1, further comprising:
an organic insulating film provided on the first insulating film and the second insulating film and comprising a through-hole,
wherein
the first thin film transistor comprises a first electrode connected to the first semiconductor layer, and
the drive electrode is provided on the organic insulating film and is in contact with the first electrode via the through-hole.

8. The detection device of claim 7, wherein
the organic insulating film comprises a stepped portion.

9. The detection device of claim 1, further comprising:
a relay electrode intersecting the detection electrode in a plan view and connected to the drive electrode,
wherein
the relay electrode is in contact with the substrate.

10. A detection device comprising:
a substrate;
a drive electrode provided on the substrate;
a detection electrode provided on the substrate and capacitively coupling with the drive electrode;
a first thin film transistor and a second thin film transistor, electrically connected to the drive electrode,
a relay electrode intersecting the detection electrode in a plan view and connected to the drive electrode,
wherein
the relay electrode is in contact with the substrate,
the first thin film transistor having a withstand voltage higher than a withstand voltage of the second thin film transistor.

11. The detection device of claim 10, wherein
the first thin film transistor comprises a first gate electrode and a first semiconductor layer,
the second thin film transistor comprises a second gate electrode and a second semiconductor layer, and
a distance from the first gate electrode to the first semiconductor layer is greater than a distance from the second gate electrode to the second semiconductor layer.

12. The detection device of claim 11, further comprising a first insulating film and a second insulating film both stacked on the substrate,
wherein
the first semiconductor layer and the second semiconductor layer are in a same layer and are located between the first insulating film and the second insulating film,
the first gate electrode opposes the first semiconductor layer via the first insulating film, and
the second gate electrode opposes the second semiconductor layer via the second insulating film.

13. The detection device of claim 12, wherein
the first insulating film has a thickness greater than that of the second insulating film.

14. The detection device of claim 12, wherein
the first insulating film has a first relative permittivity and the second insulating film has a second relative permittivity, the first relative permittivity being lower than the second relative permittivity.

15. The detection device of claim 12, wherein
the second thin film transistor further comprises a third gate electrode opposing the second semiconductor layer via at least the first insulating film.

16. The detection device of claim 15, wherein
the third gate electrode is formed of a same material as that of the first gate electrode.

17. The detection device of claim 15, further comprising:
an organic insulating film,
wherein
the first insulating film is provided on the second insulating film,
the organic insulating film is provided on the first insulating film, and
the third gate electrode is provided between the organic insulating film and the first insulating film.

18. The detection device of claim 12, further comprising:
an organic insulating film provided on the first insulating film and the second insulating film and comprising a through-hole,
wherein
the first thin film transistor comprises a first electrode connected to the first semiconductor layer, and
the drive electrode is provided on the organic insulating film and is in contact with the first electrode via the through-hole.

19. The detection device of claim 18, wherein
the organic insulating film comprises a stepped portion.

* * * * *